United States Patent
Hammond Cunningham et al.

(10) Patent No.: US 7,220,452 B2
(45) Date of Patent: May 22, 2007

(54) MULTILAYER TRANSFER PATTERNING USING POLYMER-ON-POLYMER STAMPING

(75) Inventors: Paula T. Hammond Cunningham, Newton, MA (US); Juhyun Park, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 514 days.

(21) Appl. No.: 10/441,898

(22) Filed: May 18, 2003

(65) Prior Publication Data

US 2004/0086709 A1 May 6, 2004

Related U.S. Application Data

(63) Continuation-in-part of application No. 10/285,337, filed on Oct. 31, 2002, now abandoned.

(60) Provisional application No. 60/335,020, filed on Oct. 31, 2001.

(51) Int. Cl.
*B05D 1/28* (2006.01)
(52) U.S. Cl. .................... 427/258; 427/269; 427/287
(58) Field of Classification Search ............... 427/256, 427/258, 269, 287, 280, 286, 429
See application file for complete search history.

(56) References Cited

U.S. PATENT DOCUMENTS

| | | | | |
|---|---|---|---|---|
| 2,639,998 | A | 5/1953 | Pavlic et al. ................... | 117/38 |
| 5,512,131 | A | 4/1996 | Kumar et al. ............. | 156/655.1 |
| 5,900,160 | A | 5/1999 | Whitesides et al. ........... | 216/41 |
| 6,048,623 | A | 4/2000 | Everhart et al. ............. | 428/464 |
| 6,180,239 | B1 | 1/2001 | Whitesides et al. ...... | 428/411.1 |
| 6,518,168 | B1 | 2/2003 | Clem et al. ................. | 428/623 |

OTHER PUBLICATIONS

Jiang et al., "Polymer-on-Polymer Stamping: Universal Approaces to Chemically Patterned Surfaces," Langmuir 2002, 18, 2607-2615.*
Anthamatten and Hammond; "A Sax Study of Microstructure Ordering Transitions in Liquid Crystalline Side-Chain Diblock Copolymers", Macromelecules, 32: 8066-8076, (1999).
Clark and Hammond; "The Role of Secondary Interactions in Selective Electrostatic Multilayer Deposition", Langmuir, 16: 10206-10214, (2000).
Clark et al.; "Ionic Effects of Sodium Chloride on the Templated Deposition of Polyelectrolytes Using Layer-by-Layer Ionic Assembly", Macromolecules 30: 7237-7244, (1997).
Clark et al.; "Creating Macrostructures of Luminescent Organic Thin Films Using Layer-by-Layer Assembly", Adv. Mater. 11(12): 1031-1035, (1999).
Chen et al.; "Selective Self-Organization of Colloids on Patterned Polyelectrolyte Templates", Langmuir, 16: 7825-7834, (2000).
Chung and Rubner; "Methods of Loading and Releasing Low Molecular Weight Cationic Molecules in Weak Polyelectrolyte Multilayer Films", Langmuir 18: 1176-1183, (2002).
Dubas and Schlenoff; "Swelling and Smoothing of Polyelectrolyte Multilayers by Salt", Langmuir, 17: 7725-7727, (2001).
Farhat and Schlenoff; "Corrosion Control Using Polyelectrolyte Multilayers", Electrochemical and Solid-State Letters, 5(4): B13-B15, (2002).
Farhat and Schlenoff; "Ion Transport and Equilibria in Polyelectrolyte Multilayers", Langmuir, 17: 1184-1192, (2001).
Geotting et al.; "Microcontact Printing of Alkanephosphonic Acids on Aluminum :Pattern Transfer by Wet Chemical Etching", Langmuir, 15: 1182-1191,(1999).
Hammond Paula; "Toward Plastic Electronics: Patterned Electroactive Organic Materials Using Polymer-on-Polymer Stamping", www.fenske.che.psu.edu/Seminars/fall2002/ab_hammond.html.
Hammond and Whitesides; "Formation of Polymer Microstructures by Selective Deposition of Polyion Multilayers Using Patterned Self-Assembled Monolayers as a Template", Macromolecules, 28: 7569-7571, (1995).
Jiang et al.; "Polymer-on-Polymer Stamping: Universal Approaches to Chemically Patterned Surfaces", Langmuir, 18: 2607-2615, (2002).
Jiang and Hammond; "Selective Deposition in Layer-by-Layer Assembly: Functional Graft Copolymers as Molecular Templates", Langmuir 16: 8501-8509, (2000).
Jiang et al.; "Exploring the Rules for Selective Deposition: Interactions of Model Polyamines on Acid and Oligoethylene Oxide Surfaces", Langmuir, 18: 1131-1143, (2002).
Jiang et al.; "Side-by-Side Directed Multilayer Patterning Using Surface Templates", Adv. Mater. 13(22): 1669-1673, (Nov. 16, 2001).
Lahiri et al.; "Patterning Ligands on Reactive SAMs by Microcontact Printing", Langmuir, 15: 2055-2060, (1999).
Lee et al.; "Controlled Cluster Size in Patterned Particle Arrays Via Directed Adsorption on Confined Surfaces", Adv. Mater., 14(8):572-577, (Apr. 18, 2002).
Mamedov et al; "Nanorainbows: Graded Semiconductors Films from Quantum Dots", J. Am. Chem. Soc. 123: 7738-7739, (2001).
Wang et al.; "Polyelectrolyte Multilayer Nanoreactors for Preparing Silver Nanoparticle Composites: controlling Metal Concentration and Nanoparticle Size", Langmuir 18: 3370-3375, (2002).

(Continued)

*Primary Examiner*—William Phillip Fletcher, III
(74) *Attorney, Agent, or Firm*—Dana M. Gordon; Foley Hoag LLP

(57) ABSTRACT

One aspect of the present invention relates to a method for transferring a patterned polyelectrolyte multilayer from a first surface, e.g., a PDMS stamp, to a second surface, e.g. fabric or a non-woven material, wherein the patterned polyelectrolyte multilayer on the first surface is brought into contact with the second surface in order to transfer the polyelectrolyte multilayer from the first surface to the second surface. Another aspect of the present invention relates to a stamp comprising a surface coated with a polyelectrolyte multilayer suitable for transfer to a substrate using the aforementioned method of transferring patterned multilayers.

22 Claims, 22 Drawing Sheets

OTHER PUBLICATIONS

Wu et al.; "Mixed Surface Morphologies of Well-Defined Smectic Diblock Copolymer Ultrathin Films", Macromolecules 33: 1108-1110, (2000).

Yang and Rubner; "Micropatterning of Polymer Thin Films with ph-Sensitive and Cross-linkable Hydrogen-Bonded Polyelectrolyte Multilayers", JACS, 124(10): 2100-2101, (2002).

* cited by examiner

Figure 1
Concept of Multilayer Transfer Patterning
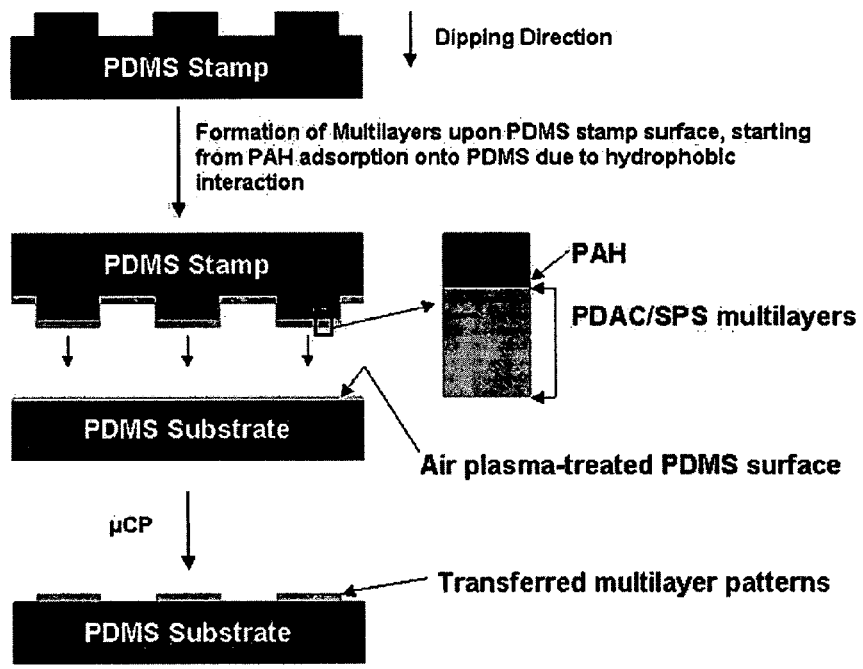
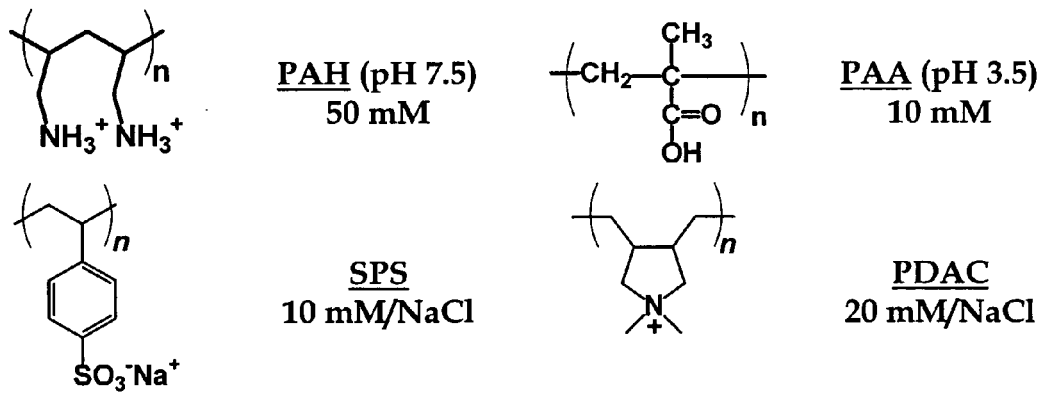
* Plasma : Air, 20 sec, 0.18~0.20 torr, 60W
* Contact time : 30 min
* Stamp : 30x30 μm2 positive squares

Figure 2

Prerequisite for Transferring Multilayer $$F_{stamp\text{-}multilayer} < F_{multilayer\text{-}substrate}$$

To make difference in the interaction forces

Previous Conditions
- Plasma treatment
  : Stamp – Air, 20 sec, 0.2 torr, 60 W
  : Substrate – Oxygen, 1 min, 0.2 torr, 60 W

- Outermost layer contacted with
  : Stamp – PAH (pH=7.5)
  : Substrate – PDAC
  : 5PAH/PAA(7.5/3.5)-5.5PDAC/SPS bilayers Current Conditions
- Plasma treatment
  : Stamp – Only use hydrophobic interaction
  : Substrate – Air, 20 sec, 0.2 torr, 60 W

- Outermost layer contacted with
  : Stamp – PAH (pH=7.5)
  : Substrate – PDAC
  : PAH(7.5)-5PDAC/SPS bilayers Pattern : 30X30 µm² squares

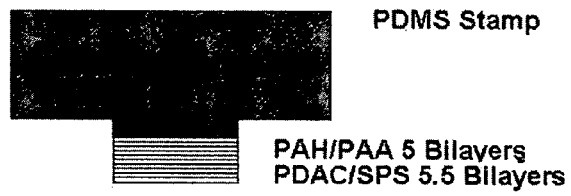

PDMS Stamp

PAH/PAA 5 Bilayers
PDAC/SPS 5.5 Bilayers

PDMS Substrate

Figure 3
Results : OM, FM, & AFM
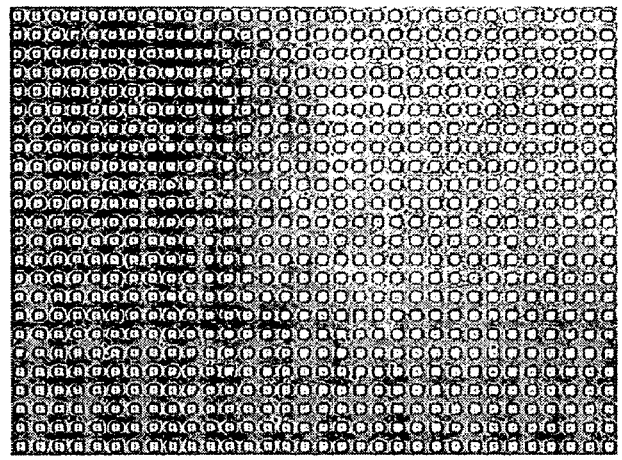
OM of 5PAH/PAA-5.5PDAC/SPS
In a reflection mode
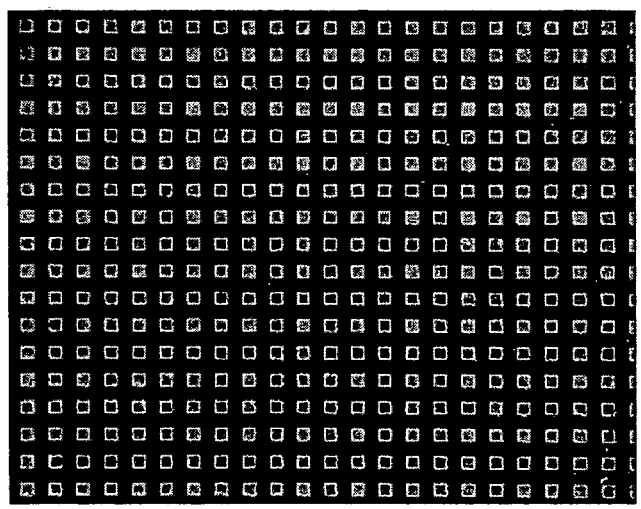
FM of 5PAH/PAA-5.5PDAC/SPS
Stained by fluoresein disodium salt Figure 3 (continued)
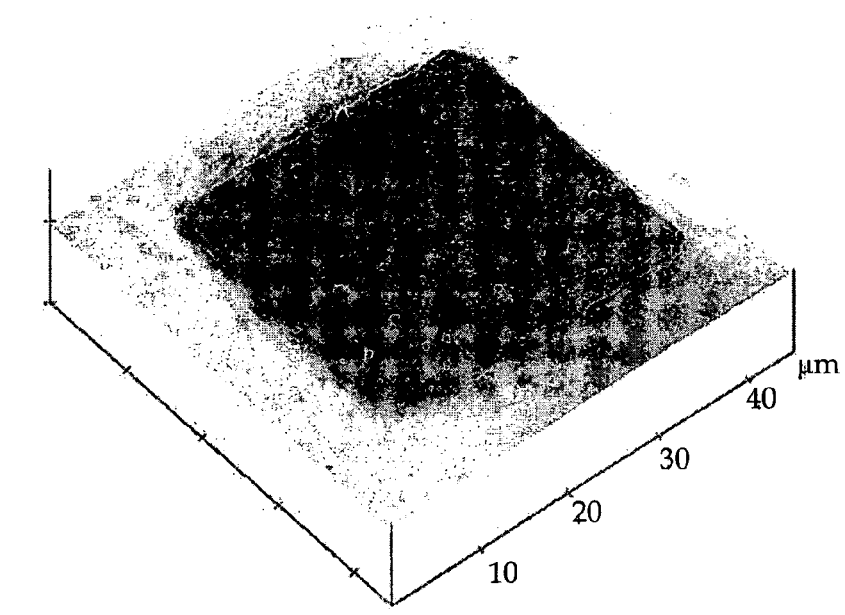
AFM of PAH-5PDAC/SPS
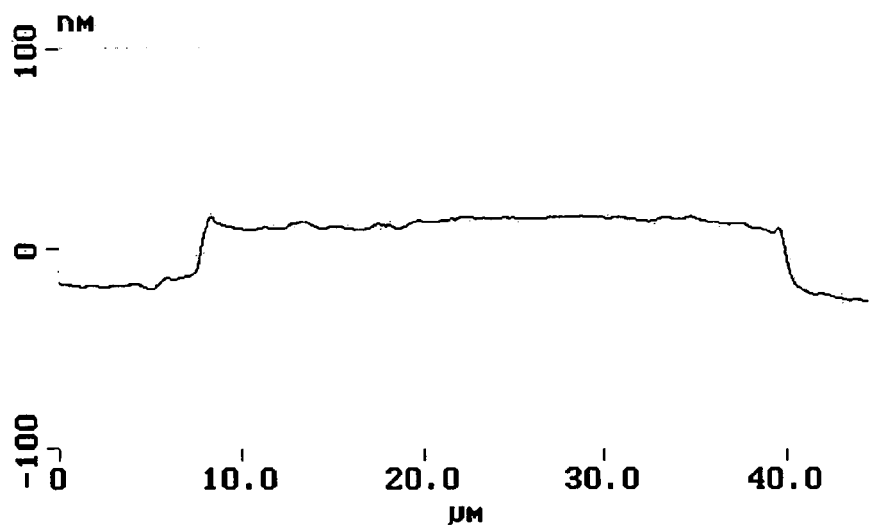
Cross-section AFM of PAH-5PDAC/SPS
Thickness = 27 nm, Roughness = 1 nm Figure 4
Hydrophobic Adsorption of Polyelectrolytes
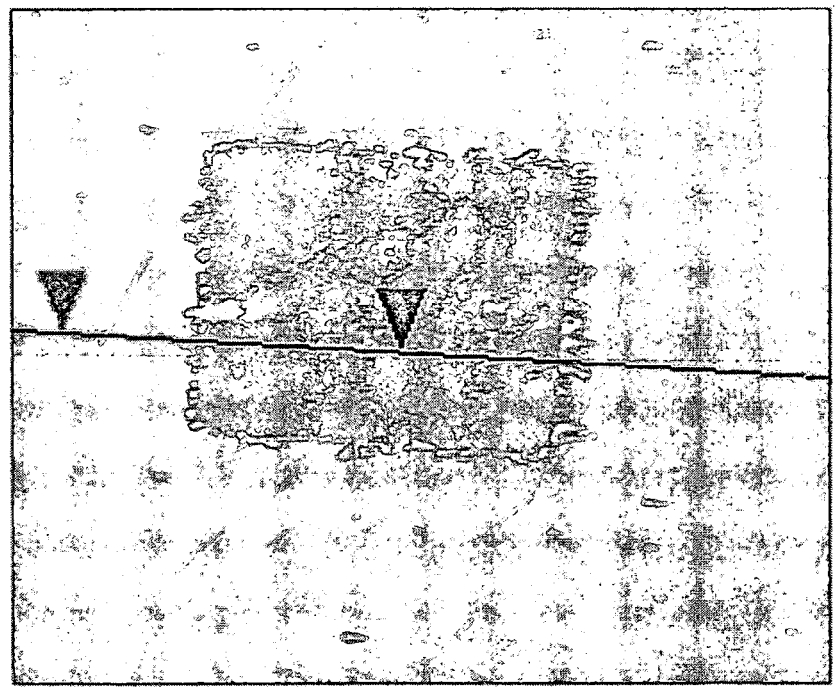
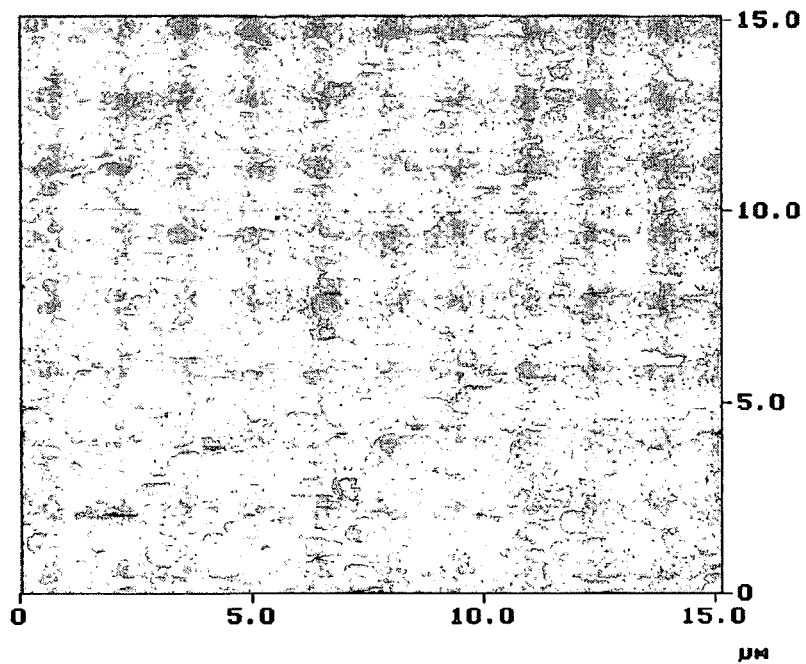
10.5 PAH/PAA(pH 7.5/3.5)

5PAH/PAA(pH 7.5/3.5)-5.5PDAC/SPS

PAH(pH 7.5) - 5PDAC/SPS

Figure 5
Hydrophobic Adsorption of Polyelectrolytes
10.5 PAH/PAA bilayers
On the stamp before stamping
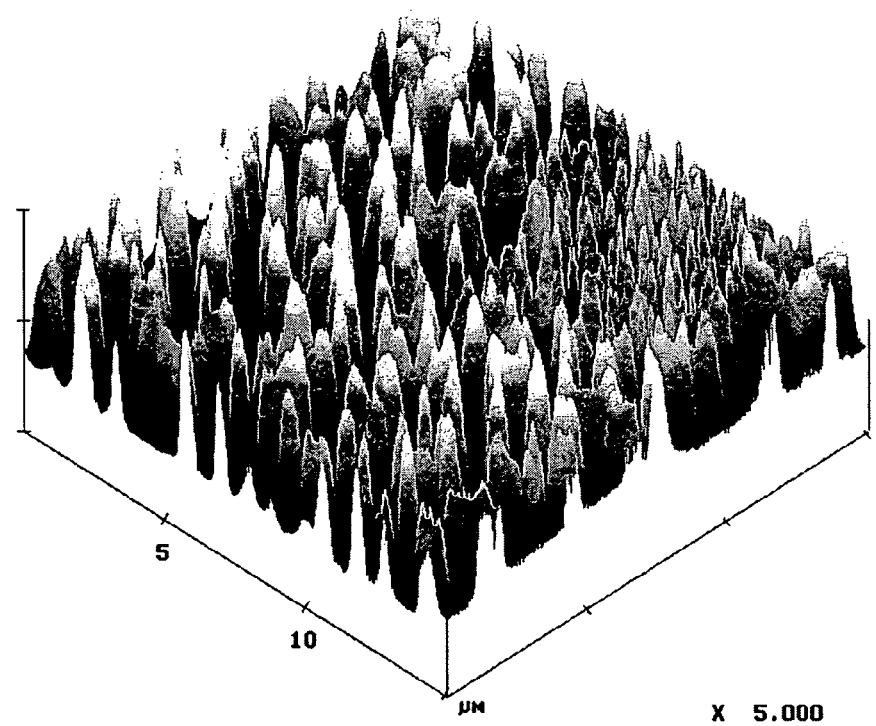
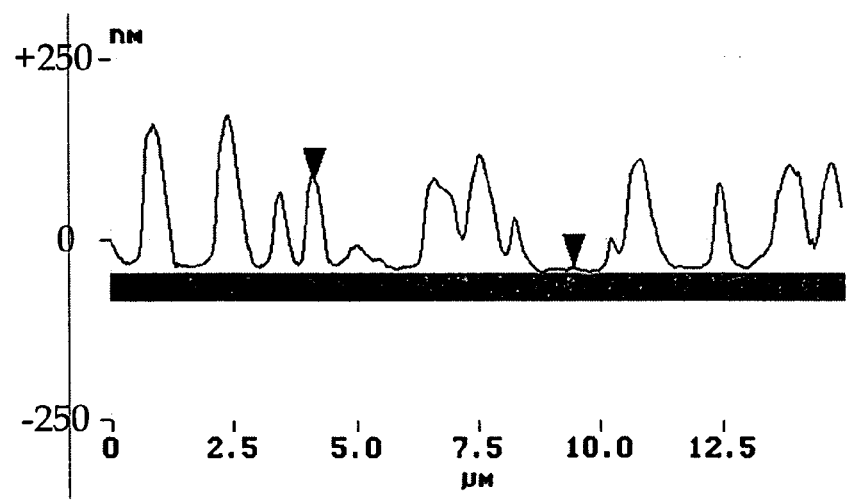

Figure 6

Hydrophobic Adsorption of Polyelectrolytes

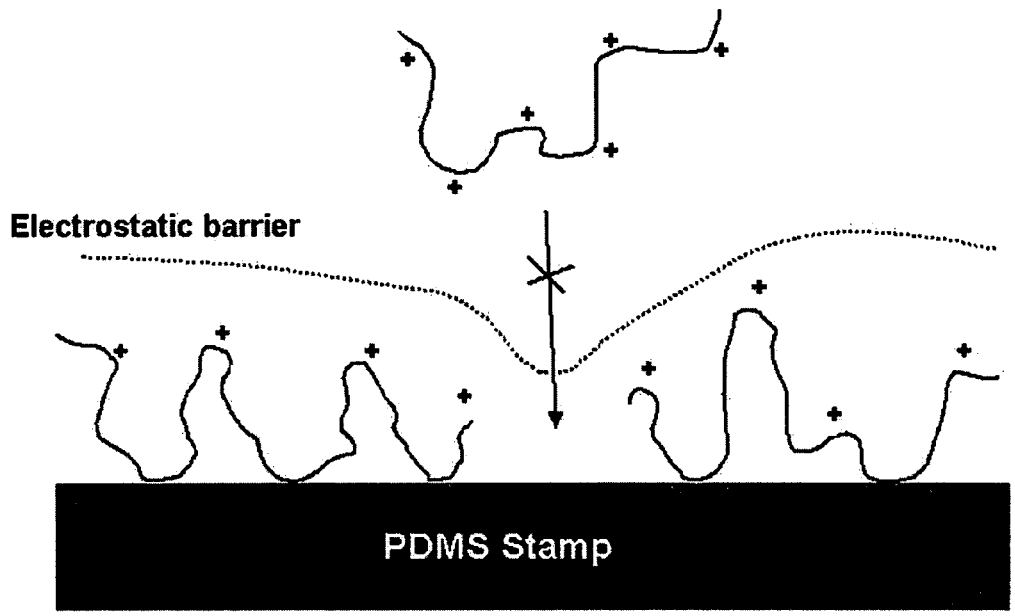

Dipping of PAH as the first layer onto PDMS
stamp : Hydrophobic adsorption
PAH : pH 7.5, 50 mM, MW=70k
Dipping time : 15 min
Rinsing : 1 min, only one step The rate of adsorption of PAH molecules is strongly reduced by an electrostatic barrier which is determined by the surface coverage.

: Strong kinetic limitation of the adsorption

The following dipping steps after the first incomplete layer do not guarantee the formation of multilayers.

Figure 7
Hydrophobic Adsorption of Polyelectrolytes
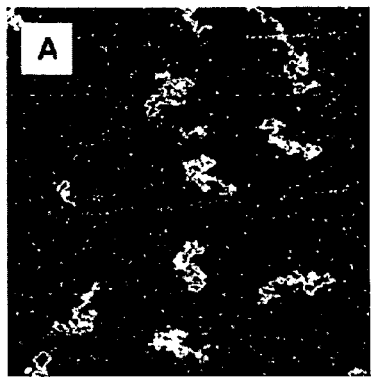
pH 2.0
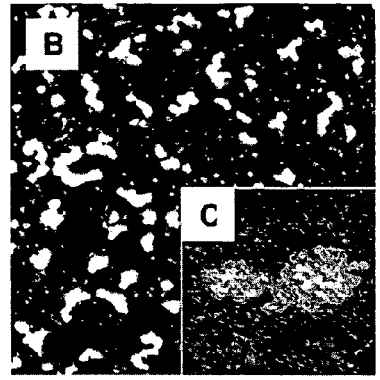
pH 3.5 and NaCl 0.02 mol/L
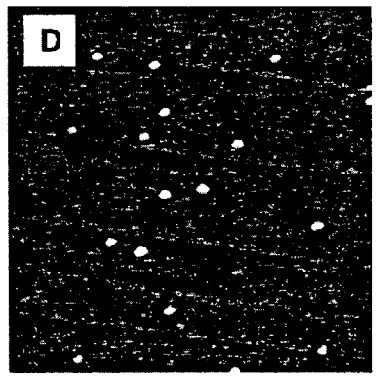
pH 3.5 NaCl 1.0 mol/L
AFM images of P2VP(MW=385k) adsorbed on hydrophilic mica surfaces : Conformational transitions from stretched wormlike coil to necklace-like Globule and to compact globule as the fraction of charged monomers decreases with an increase of pH and ionic strength (the conc. of salt). (JACS 2002, 124, 3218)
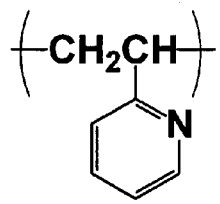

Figure 8

A Suggestion for the Better Stability

5~10 PAH/PAA bilayers – Polysiloxane block copolymers

* Plasma treatment and contact

: Covalent bonding between the outermost polysiloxane and PDMS surfaces

* Heat treatment at a high temperature

: Transition from ionic to covalent crosslinking in multilayer

: stable multilayers during reactions in organic solvents.

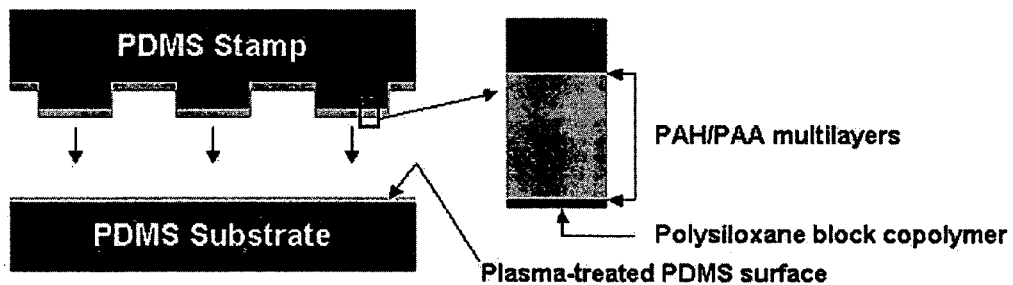

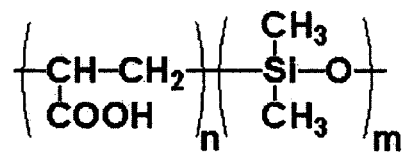

A possible structure of a polysiloxane block copolymer

Figure 9
(a)
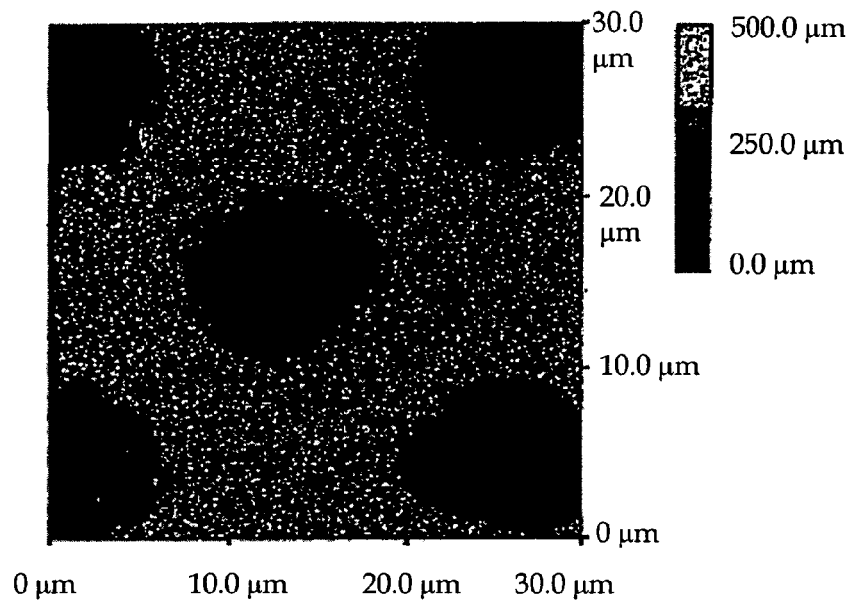
(b)
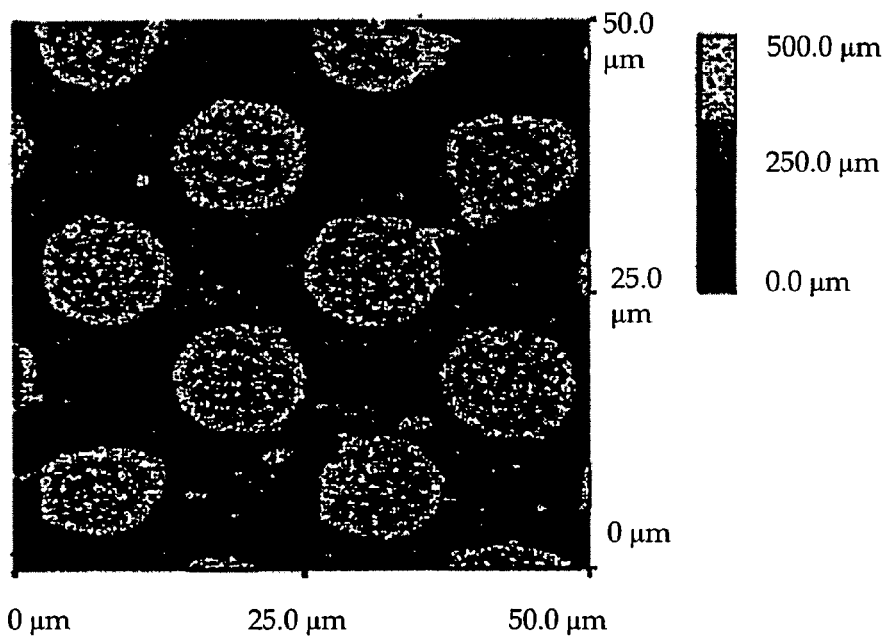

(c)

Figure 10 (continued)
(c)
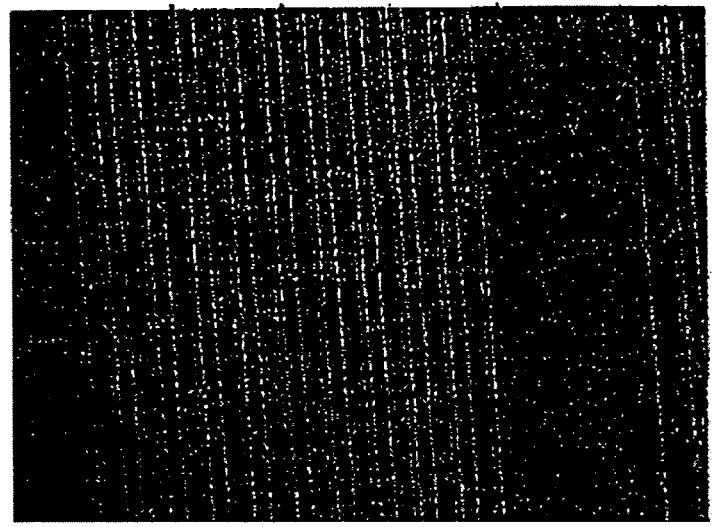
(d)
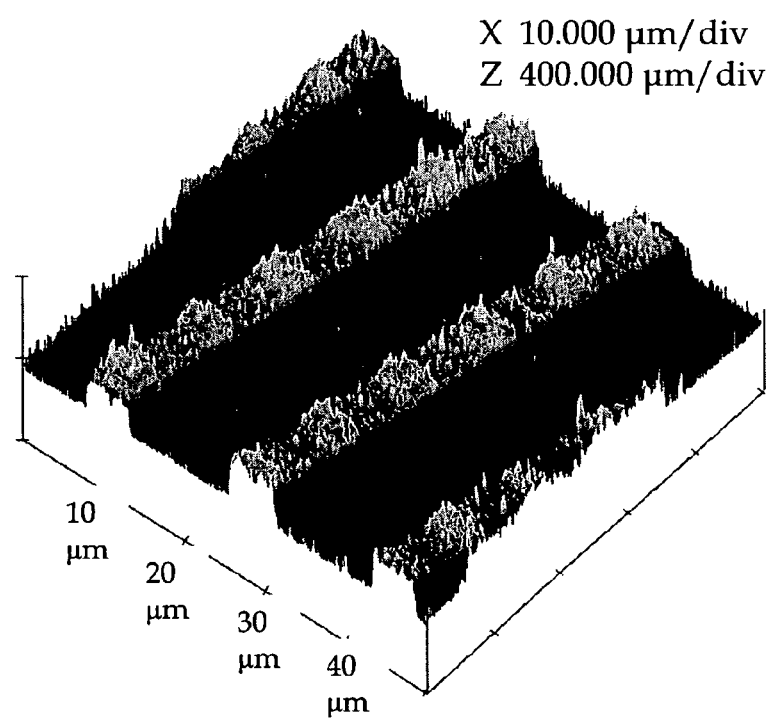
(LPEI/PAA)4(LPEI/Ru)12 onto (PDAC/SPS)12
314b.001

Figure 11
(a)
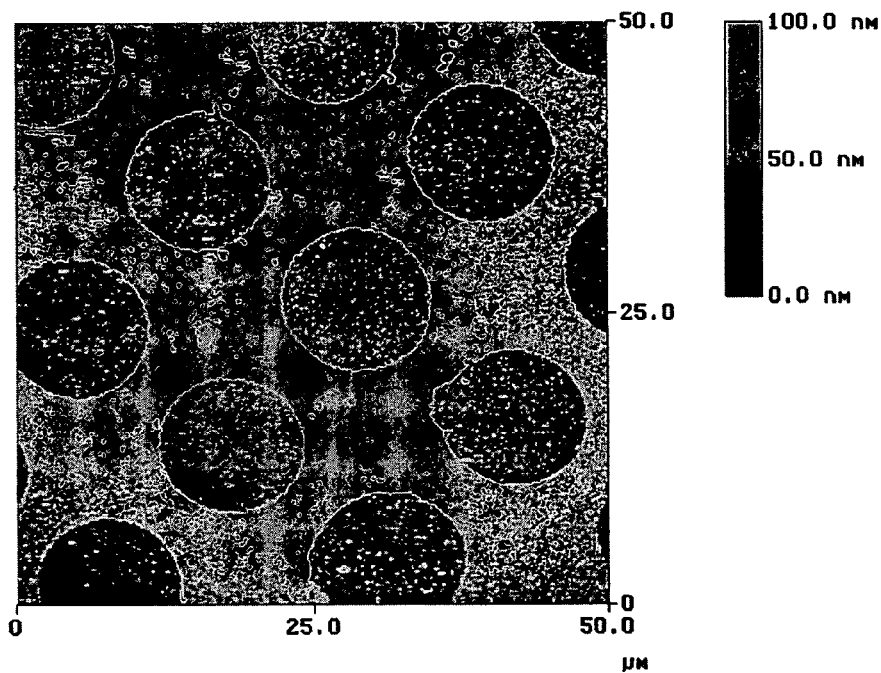
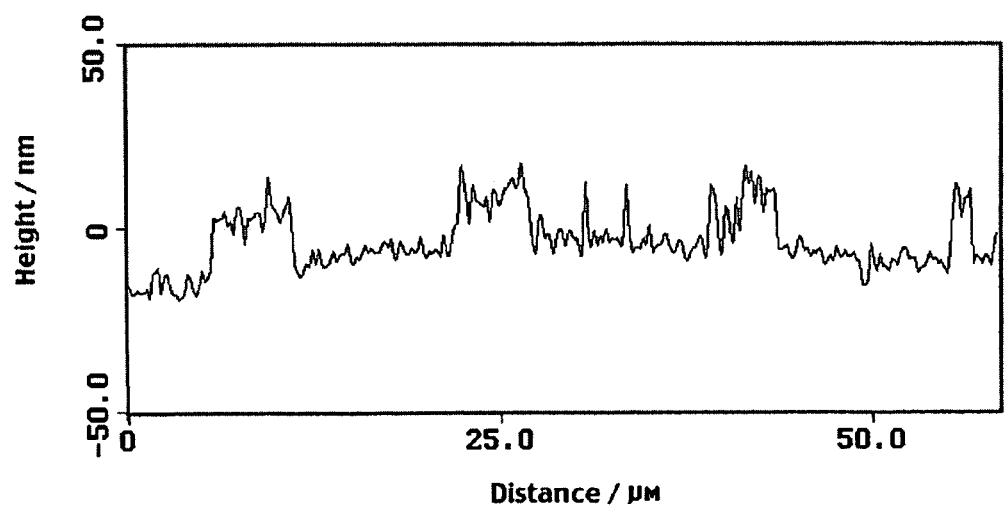

Figure 11 (continued)
(b)
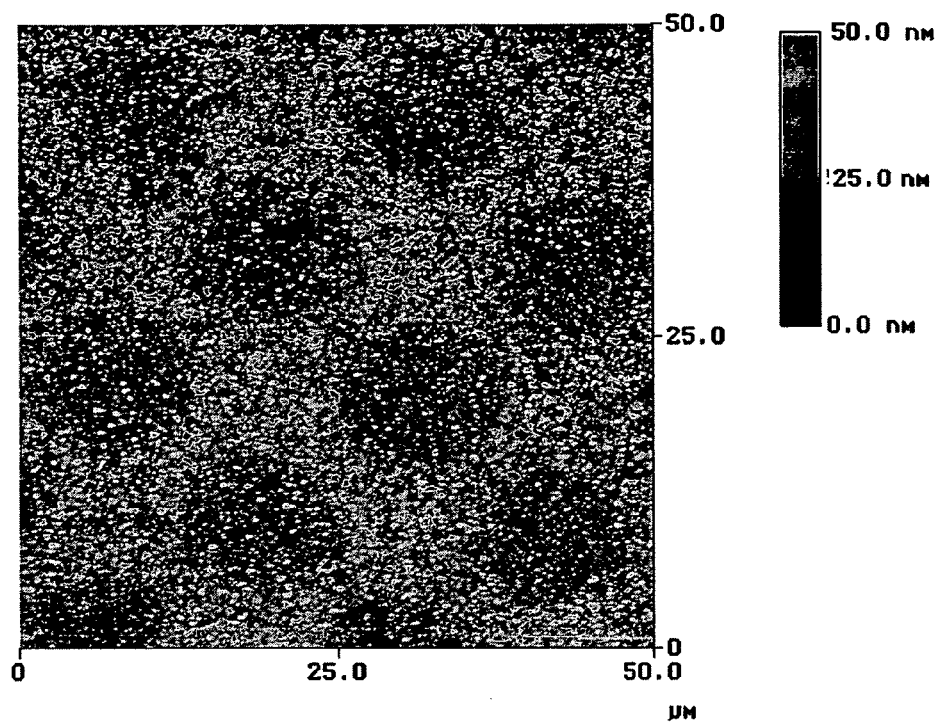
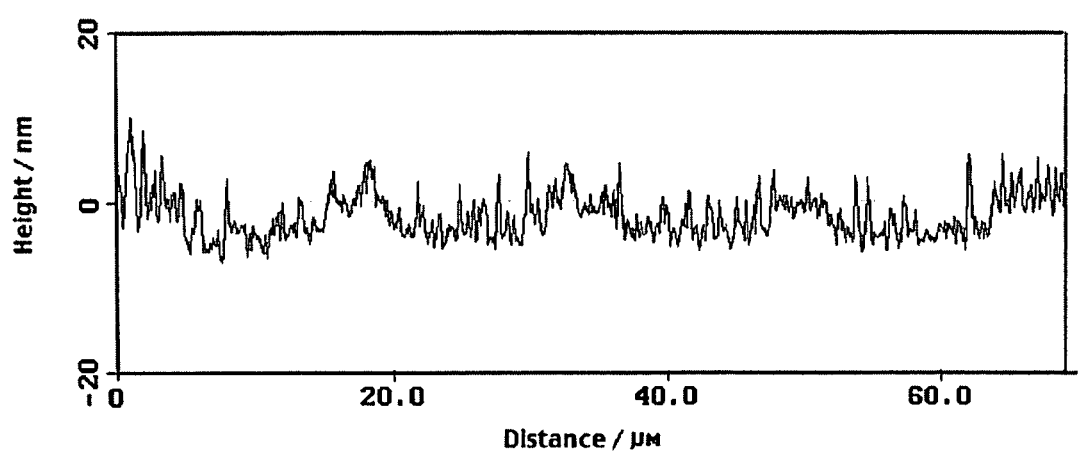

Figure 14
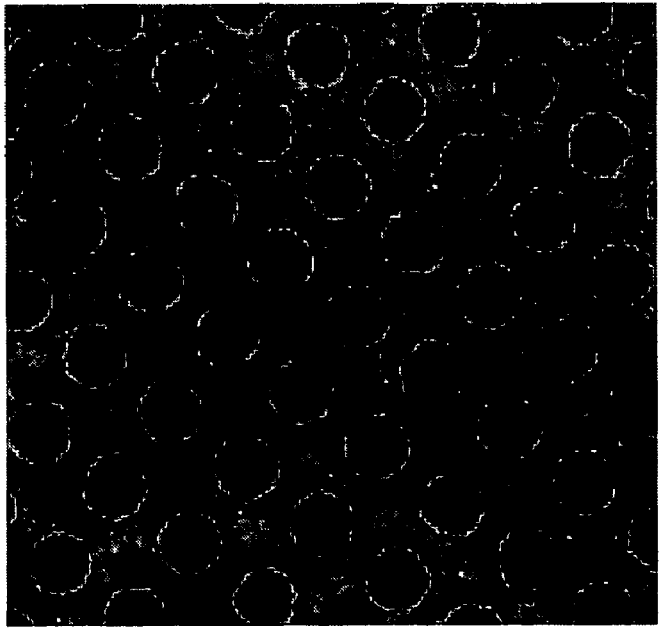

Figure 15
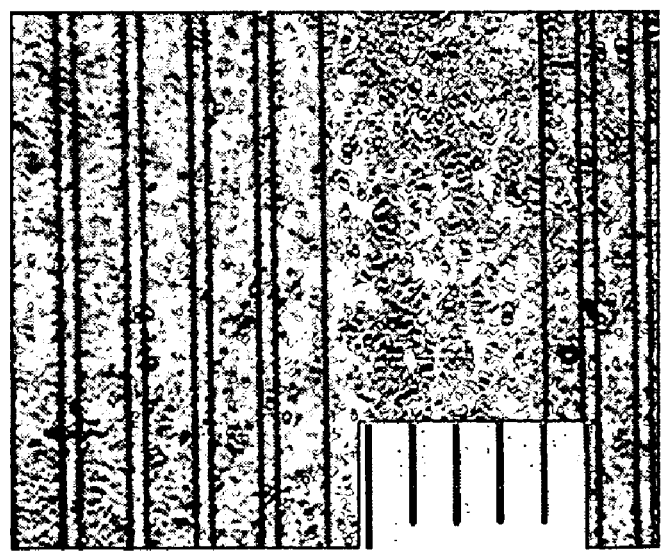

MULTILAYER TRANSFER PATTERNING USING POLYMER-ON-POLYMER STAMPING

RELATED APPLICATIONS

This application is a continuation-in-part of U.S. patent application Ser. No. 10/285,337, filed Oct. 31, 2002 now abandoned, the specification of which is hereby incorporated by reference; which claims the benefit of priority to U.S. Provisional Patent Application Ser. No. 60/335,020, filed Oct. 31, 2001.

GOVERNMENT SUPPORT

This invention was made with support provided by the Office of Naval Research (Grant No. N00014-96-1-0789) and the MRSEC program of the National Science Foundation (Grant No. DMR-9400334); therefore, the government has certain rights in the invention.

BACKGROUND OF THE INVENTION

Organic thin films continue to attract great interest in the materials science community due to their ease of processing, ease of functionalization, light weight and flexibility. Significant progress has been achieved in the past 10–20 years, presenting the possibility of molecular level control in molecular and macromolecular composite films. The ionic, layer-by-layer assembly technique, introduced by Decher in 1991, is among the most exciting recent developments in this area. Decher, G.; Hong, J.-D. *Makromol. Chem., Macromol. Symp.* 1991, 46, 321–327; Decher, G.; Hong, J.-D. *Ber. Bunsenges. Phys. Chem.* 1991, 95, 1430–1434; and Decher, G.; Hong, J. D.; Schmitt, J. *Thin Solid Films* 1992, 210/211, 831. This approach, which utilizes electrostatic interactions between oppositely charged polyion species to create alternating layers of sequentially adsorbed polyions, provides a simple and elegant means of depositing layer-by-layer sub-nanometer-thick polymer films onto a surface using aqueous solutions. Lvov, Y. M.; Decher, G. *Crystallography Reports* 1994, 39, 628–647; Ferreira, M.; Rubner, M. F. *Macromol.* 1995, 28, 7107–7114; and Tsukruk, V. V.; Rinderspacher, F.; Bliznyuk, V. N. *Langmuir* 1997, 13, 2171–2176. More recently, applications have been extended to electroluminescent LEDs, conducting polymer composites as well as the assembly of proteins and metal nanoparticle systems. Tian, J.; Wu, C. C.; Thompson, M. E.; Sturm, J. C.; Register, R. A.; Marsella, M. J.; Swager, T. M. *Adv. Mater.* 1995, 7, 395; Baur, J. W.; Kim, S.; Balanda, P. B.; Reynolds, J. R.; Rubner, M. F. *Advanced Materials* 1998, 10, 1452–1455; Cheung, J. H.; Fou, A. F.; Rubner, M. F. *Thin Solid Films* 1994, 244, 985–989; Ferreira, M.; Cheung, J. H.; Rubner, M. F. *Thin Solid Films* 1994, 244, 806–809; Lvov, Y.; Ariga, K.; Ichinose, I.; Kunitake, T. *J. Am. Chem. Soc.* 1995, 117, 6117–6123; and Ariga, K.; Lvov, Y.; Onda, M.; Ichinose, I.; Kunitake, T. *Chemistry Letters* 1997, 125–126.

Application of organic thin films to integrated optics, microelectronic devices, sensors and optical memory devices requires a means of patterning and controlling the surface architecture. Photolithography is the conventional patterning technique of choice, but lithographic techniques require materials designed to exhibit efficient responses to irradiation with a chemical change, namely crosslinking or degradation; these requirements are not trivial. Finally, light-based lithography can be limited in its application to curved, nonplanar surfaces, such as optical lenses and fibers, and multiple processing steps are required to create three dimensional, multiple level microstructures.

Patterning polymeric thin films in situ through the use of chemically patterned surfaces as templates for ionic multilayer assembly has been presented. Hammond, P. T.; whitesides, G. M. *Macromolecules* 1995, 28, 7569; Clark, S. L.; Montague, M.; Hammond, P. T. *Supramol. Sci.* 1997, 4, 141–146; Clark, S. L.; Montague, M. F.; Hammond, P. T. *Macromol.* 1997, 30, 7237–7244; Clark, S. L.; Hammond, P. T. *Adv. Mat.* 1998, 10, 1515–1519; Clark, S. L.; Handy, E. S.; Rubner, M. F.; Hammond, P. T. *ACS Polym. Prepr.* 1998, 39, 1079–1080; Clark, S. L.; Montague, M. F.; Hammond, P. T. *ACS Symp. Ser.* 1998, 695, 206–219; and Clark, S. L.; Handy, E. S.; Rubner, M. F.; Hammond, P. T. *Advanced Materials* 1999, 11, 1031–1035. Selective deposition was achieved by introducing alternating regions of two different chemical functionalities on a surface: one which promotes adsorption; and a second which effectively resists adsorption of polyions on the surface. More recent explorations have illustrated that by adjusting the ionic strength, pH and polyion chemical structure, one can tune the interactions between polyions and the surface functional groups, allowing different polyion pairs to be adsorbed on specific regions of the surface based on electrostatic, hydrogen bonding, and hydrophobic interactions.

One class of thin films is polyelectrolyte multilayers. These relatively inexpensive materials can be used electro-optical, conducting, and luminescent applications; recent developments include new functionalities such as electrochromic thin films, photovoltaics, ionically conducting systems, and even new biologically functional systems for cell templating and drug delivery. For each of these interesting functionalities, new applications in the areas of electro-optic and electronic devices, flexible displays, micropower and sensor applications, it is critical to be able to control the two- and three-dimensional placement of these films on substrates. Methods of patterning polyelectrolyte multilayers in-situ during the adsorption process utilizing chemically patterned surfaces that guide polymer adsorption to specific regions based on selective deposition have been reported. One important advantage to this approach is the fact that it is non-lithographic, thus allowing the creation of low-cost functional devices. Some challenges with this method include the need to tune the selectivity of deposition via processing conditions and polyion composition to achieve high selectivity. More recent approaches have been developed for patterning multilayers, including ink-jet printing via a subtractive mechanism of "erasing" multilayer films, and a range of photolithographic approaches. Many of these methods require the design a photolytic component either within the film or in the underlying layers, and therefore limit the range of polymer films used in the approach, as well as increasing the cost of manufacturing. Hence, a highly selective method for adhering a wide variety of polyelectrolyte films to a substrate would alleviate some of the current limitations.

The fabrication of polyelectrolyte multilayer thin films has received much attention recently as a simple yet versatile technique for assembling various thin film optoelectronic devices and nanostructured thin film coatings (for a review, see: Decher, G. *Science* 1997, 277, 1232). Since the layer-by-layer process creates nanostructured-controlled polyelectrolyte complexes, which have already exhibited a long research history as biomaterials, several groups have begun to realize the potential of multilayers for biomedical applications, including biosensor and cell encapsulation applications. Michaels, A. S. *Ind. Eng. Chem.* 1965, 57, 32; Decher, G.; Lehr, B.; Lowack, K.; Lvov, Y.; Schmitt, J. *Biosens. Bioelectron.* 1994, 9, 677; Caruso, F.; Niikura, K.; Furlong, D. N.; Okahata, Y. *Langmuir* 1997, 13, 3427; Schneider, S.; Feilen, P. J.; Slotty, V.; Kampfner, D.; Preuss, S.; Berger, S.; Beyer, J.; Pommersheim, R. *Biomaterials* 2001, 22, 1961. Recently, some groups have investigated more specifically the interactions of multilayers with living cells. Chluba, J.; Voegel, J.-C.; Decher, G.; Erbacher, P.; Schaaf, P.; Ogier, J. *Biomacromolecules* 2001, 2, 800; Grant, G. G. S.; Koktysh, D. S.; Yun, B.; Matts, R. L.; Kotov, N. A. *Biomed. Microdevices* 2001, 3, 301; Serizawa, T.; Yamaguchi, M.; Matsuyama, T.; Akashi, M. *Biomacromolecules* 2000, 1, 306; Elbert, D. L.; Herbert, C. B.; Hubbell, J. A. *Langmuir* 1999, 15, 5355; Tryoen-Tóth, P.; Vautier, D.; Haikel, Y.; Voegel, J.-C.; Schaaf, P.; Chluba, J.; Ogier, J. *J. Biomed. Mater. Res.* 2002, 60, 657. For instance, it has been shown that melanoma cells could sense and respond to signaling hormone molecules immobilized within polylysine/polyglutamic acid multilayers, that muscle and neuronal precursor cells readily attached to collagen/sulfonated polystyrene (SPS) multilayers, and that, depending on whether chitosan or dextran sulfate was the outermost layer, multilayers assembled from those biopolymers alternately showed either pro- or anticoagulant properties, respectively, with human blood. Chluba, J.; Voegel, J.-C.; Decher, G.; Erbacher, P.; Schaaf, P.; Ogier, J. *Biomacromolecules* 2001, 2, 800; Grant, G. G. S.; Koktysh, D. S.; Yun, B.; Matts, R. L.; Kotov, N. A. *Biomed. Microdevices* 2001, 3, 301; Serizawa, T.; Yamaguchi, M.; Matsuyama, T.; Akashi, M. *Biomacromolecules* 2000, 1, 306. In addition, alginate/polylysine multilayers, when deposited onto otherwise cell-adhesive substrates, such as extracellular matrix (ECM), could render those surfaces cell resistant. Elbert, D. L.; Herbert, C. B.; Hubbell, J. A. *Langmuir* 1999, 15, 5355. The effect of the outermost surface layer of various multilayer systems on the in vitro response of osteoblasts has recently been investigated, as well. Tryoen-Tóth, P.; Vautier, D.; Haikel, Y.; Voegel, J.-C.; Schaaf, P.; Chluba, J.; Ogier, J. *J. Biomed. Mater. Res.* 2002, 60, 657.

A novel and desirable advancement in this art would be a method to stamp a polyelectrolyte microlayer directly onto other surfaces, particularly plastic substrates and multilayer films, by careful selection of surface chemistry. The motivation for establishing these routes are two-fold. First, the functionalization and subsequent patterning of ionic multilayers and other materials on a broad range of substrates, including polymeric surfaces, without elaborate pretreatment would extend the scope of the application. Second, stamping atop continuous or patterned polymer thin films, followed by subsequent selective adsorption or deposition steps would generate complex multiple level heterostructures. The ability to create multi-level microstructures with layer-by-layer assembly enables the construction of devices such as transistors, diodes, sensors, and other optical and electrical components. The chemical patterning of the top surfaces of multilayer films also brings new opportunities to incorporate other materials onto multilayer films; the use of such chemical patterns to direct materials deposition can lead to the patterning of metal electrodes, the placement of colloidal particles, or the directed deposition of other polymer films atop layer-by-layer functional thin films. Importantly, the ability to create patterned functional chemistry atop a polyelectrolyte surface would enable modification of any surface which can be covered with at least one surface layer of polyion.

SUMMARY OF THE INVENTION

One aspect of the present invention relates to a method of transferring a patterned polyelectrolyte multilayer from a first surface, e.g., a PDMS stamp, to a second surface, e.g. fabric or a non-woven material. Another aspect of the present invention relates to a stamp comprising a surface coated with a polyelectrolyte multilayer suitable for transfer to a substrate using the aforementioned method of transferring patterned multilayers. In preferred embodiments, a layer-by-layer assembly process is used to prepare a multilayer on the first surface. In preferred embodiments, non-covalent interactions were employed to form multilayers on stamps with patterns. Fundamentally, the transfer of multilayer patterns from the first surface to the second surface was based on the difference in interaction forces between first surface and the multilayer; and the second surface and the multilayer. Patterned multilayers provided stable chemical functionalities, which can be used as reaction sites and as a means for incorporating other reagent molecules and particles. Multilayers containing chemicals or particles in their structures have also been transferred. The size and shape of patterns can be controlled by fabricating stamps with various kinds of patterns. The surface functionalities of transferred patterns can be controlled, e.g., by varying the polyelectrolytes from which the multilayers are formed.

BRIEF DESCRIPTION OF THE FIGURES

FIG. 1 depicts a schematic illustration of the multilayer transfer patterning process FIG. 2 depicts a prerequisite for transfering a multilayer FIG. 3 depicts OM, FM, and AFM characterization of polyelectrolyte films FIG. 6 depicts hydrophobic absorption of polyelectrolytes on a PDMS stamp FIG. 7 depicts AFM images of P2VP9MS=385 k) adsorbed on hydrophilic mica surfaces FIG. 8 depicts a proposed strategy for PEM film transfer using a polysiloxane block copolymer

FIG. 11 depicts a) AFM images of PDAC stamping before rinsing, and b) after rinsing.

FIG. 14 depicts images of PDAC stamping under optimal conditions.

FIG. 15 depicts patterned PDEOT formed via selective deposition; the lighter regions are the conducting polymer film. Contrasts in the optical microscope image are due to differences in thickness. The thinner stripes are approximately 5 microns in width.

DETAILED DESCRIPTION OF THE INVENTION

Figure 4:
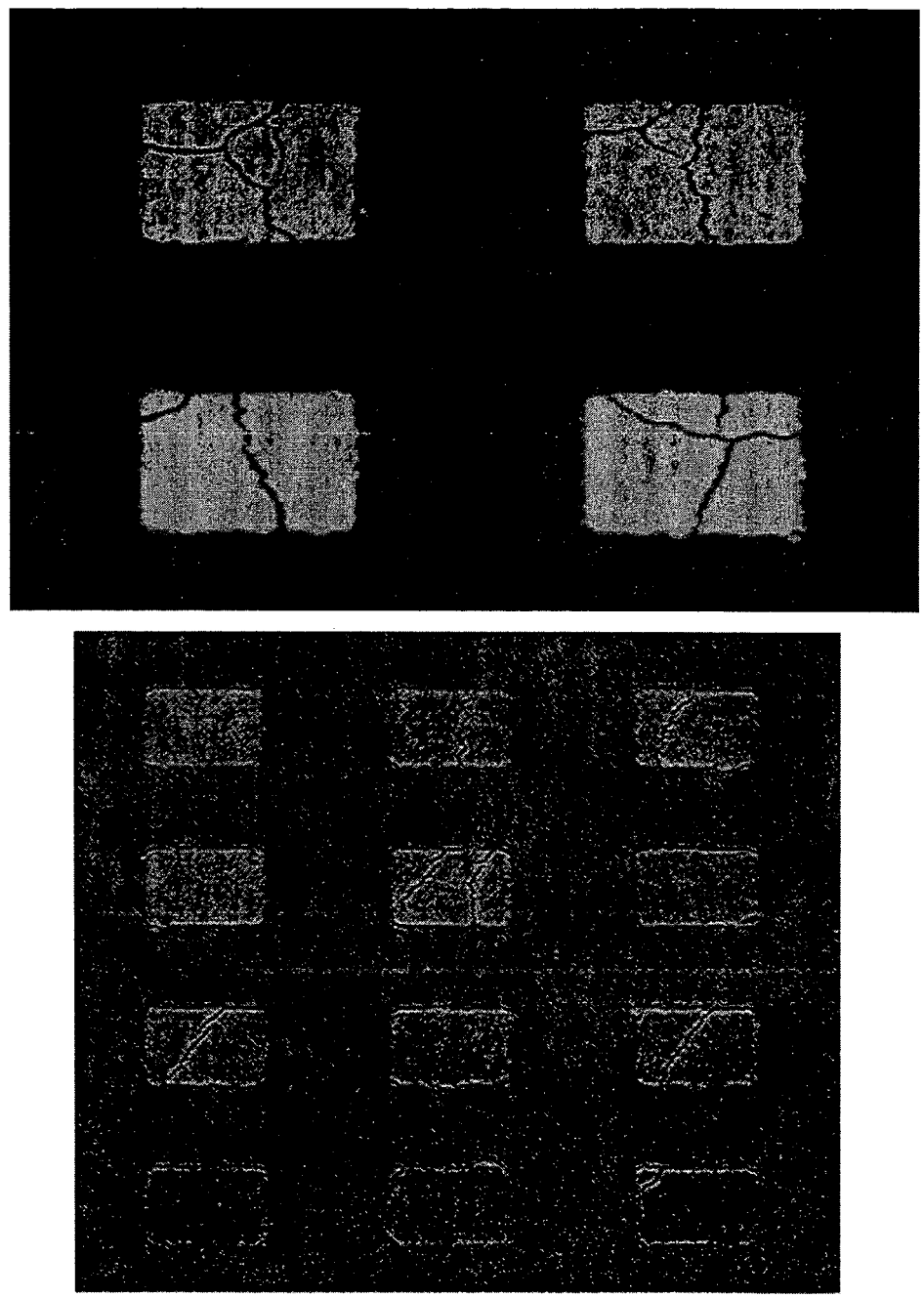
FIG. 4 depicts hydrophobic adsorption of polyelectrolytes
Figure 4:
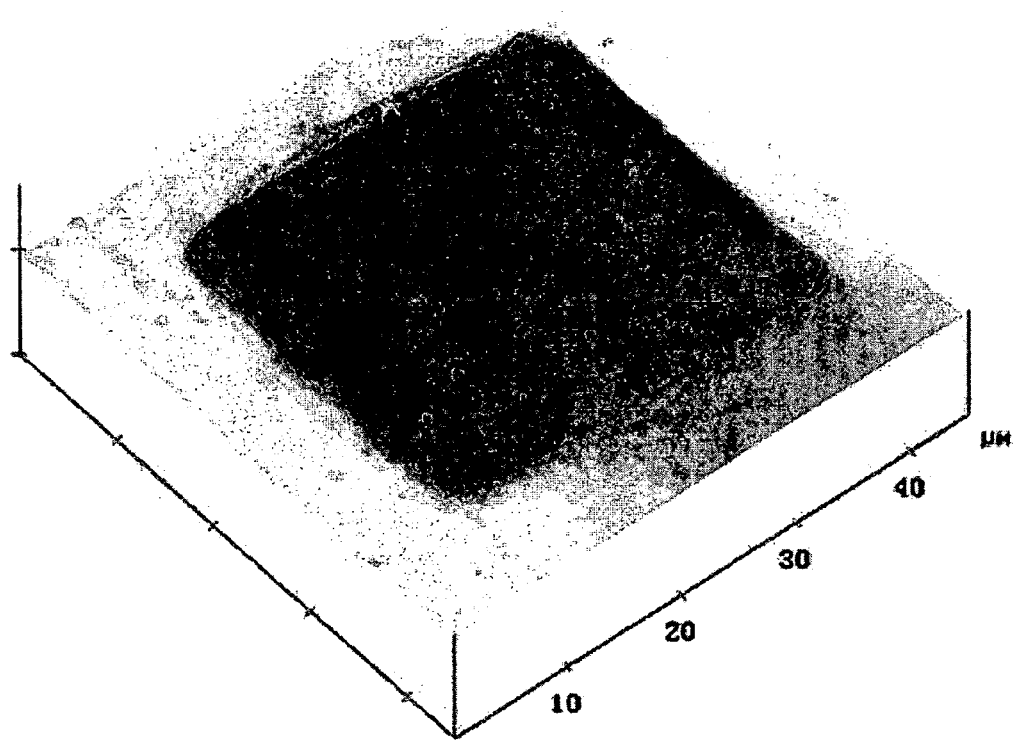

The invention will now be described more fully with reference to the accompanying examples, in which certain preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Definitions

For convenience, certain terms employed in the specification, examples, and appended claims are collected here.

The term "copolymer" as used herein means a polymer of two or more different monomers.

The term "electrolyte" as used herein means any chemical compound that ionizes when dissolved.

The term "polyelectrolyte" as used herein means a polymeric electrolyte, such as polyacrylic acid.

The term "pH" as used herein means a measure of the acidity or alkalinity of a solution, equal to 7, for neutral solutions and increasing to 14 with increasing alkalinity and decreasing to 0 with increasing acidity.

The term "pH dependent" as used herein means a weak electrolyte or polyelectrolyte, such as polyacrylic acid, in which the charge density can be adjusted by adjusting the pH.

The term "pH independent" as used herein means a strong electrolyte or polyelectrolyte, such as polystyrene sulfonate, in which the ionization is complete or very nearly complete and does not change appreciably with pH.

The term "$K_a$" as used herein means the equilibrium constant describing the ionization of a weak acid.

The term "$pK_a$" as used herein means a shorthand designation for an ionization constant and is defined as $pK_a = -\log K_a$. $pK_a$ values are useful when comparing the relative strength of acids.

The term "multilayer" as used herein means a structure comprised of two or more layers.

The abbreviation "PDMS" as used herein means poly(dimethylsiloxane).

The abbreviation "LPEI" as used herein means linear polyethyleneimine.

The abbreviation "BPEI" as used herein means branched polyethyleneimine.

The abbreviation "PS-b-PAA" as used herein means polystyrene-polyacrylic acid block copolymer.

The abbreviation "PS-b-PMA" as used herein means polystyrene-polymethacrylic acid block copolymer.

The term "stamp" as used herein means a tool or implement used to apply a composition, e.g., a solution comprising a polymer, to a surface.

The term "pattern" as used herein means an intentional arrangement of elements on a surface in such a way that the elements do not cover the entire surface. A pattern may be geometric or repetitive or both.

The term "structural feature" as used herein means a detectable deviation from planarity; for example, dots squares, polygon, spikes, triangles, columns, pyramids, or spheres.

The term "polyacrylic acid" (PAA) as used herein means a polymer with repeating monomeric units of formula [—$CH_2CH(COO^-)$—].

The term "polyallylamine hydrochloride" (PAH) as used herein means a polymer with repeating monomeric units of formula [—$CH_2CH(CH_2NH_3^+)$—].

The term "polyacrylamide" (PAAm) as used herein means a polymer with repeating monomeric units of formula [—$CH_2CH(CONH_2)$—].

The term "polymethacrylic acid" (PMA) as used herein means a polymer with repeating monomeric units of formula [—$CH_2C(CH_3)(COO^-)$—].

The terms "poly(styrene sulfonate)" (PSS) and "sulfonated polystyrene" (SPS) are used interchangeably herein, and refer to a polymer with repeating monomeric units of formula [—$CH_2CH(C_6H_4(SO_3^-))$—].

The term "polydiallyldimethylammonium chloride" (PDAC) as used herein means a polymer with repeating monomeric units of formula

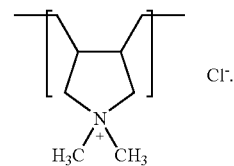

For purposes of this invention, the chemical elements are identified in accordance with the Periodic Table of the Elements, CAS version, Handbook of Chemistry and Physics, 67th Ed., 1986–87, inside cover.

Overview of a Preferred Embodiment

The present invention relates generally to the patterning of polymer multilayers by the direct transfer of a fully formed multilayer film utilizing a stamp. For an overview of polyelectrolyte multilayers, see: Decher, Gero/Schlenoff, Joseph B. (eds.); *Multilayer Thin Films: Sequential Assembly of Nanocomposite Materials* December, 2002; 524 Pages, Hardcover; ISBN 3-527-30440-1-Wiley-VCH, Weinheim. In this process, a stamp is prepared comprising microfabricated patterns on the surface of the stamp. The patterns on the surface of the stamp serve as the template for the multilayer pattern. In certain embodiments, the stamp comprises poly(dimethyl siloxane) (PDMS); there are known procedures for microfabrication of PDMS surfaces. Then, a polyelectrolyte multilayer is fabricated on the surface of the stamp by the alternating adsorption of a polyanion/polycation pair (FIG. 1). In a preferred embodiment, the polymeric layer contacting the stamp binds to the surface of the stamp though hydrophobic interactions. In certain embodiments, the polyionic layer that binds to the stamp is PAH. The strength of the association between the surface of the stamp and the polymeric layer is ideally strong enough to withstand stresses encountered during preparation of the multilayer, but yet not so strong as to prevent transfer of the multilayer to the substrate.

The composite nature of the multilayer film is advantageous because the properties of the multilayer film can be tuned to a specific application. For example, the thickness of the multilayer is controlled by the number of polyanion/polycation absorption cycles. Furthermore, the individual polyanion or polycation components can be selected to impart a desired property to the film. This method can also be used to incorporate additional materials between the layers of the film.

Once the multilayer has been prepared, the stamp is contacted with a substrate to transfer of the multilayer film. In certain embodiments, the surface of the substrate comprises functional groups that are oppositely charged compared to the surface of the multilayer contacting the substrate. In a preferred embodiments, the substrate is PDMS that has been treated with air-plasma to generate a negatively charged surface. In certain embodiments, a negatively charged substrate was prepared by building a $(PDAC/SPS)_{10}$ multilayer platform with a SPS top surface on a silicon wafer. In a preferred embodiment, the substrate is PDMS treated with air-plasma and the substrate-binding layer of the multilayer film is is PDAC.

One advantage of the multilayer-stamping method is that the multilayer is transferred in its entirety to the substrate resulting in a patterned multilayer thin film on the substrate surface at ca. 100% selectivity. The ability to transfer the film directly opens up a number of possibilities that have not yet been realized in the micropatterning of functional thin films. These include the ability to achieve nonlithographic patterns at perfect selectivity, the potential to transfer the thin film to a nearly limitless number of substrates with appropriate surface treatment, and the possibility of extending the technique to both multi-component and 3-D structures through multiple sequential transfer steps to create complete devices or device components.

General advantages of the present invention include direct patterning of stable multilayers, process ease compared to photolithography, and the opportunity to easily tune surface chemistry of substrates by changing multilayer composition, and incorporating other functionalities. In addition, multilayer transfer patterning provides an easy and useful technique to introduce surface chemistry onto poly(dimethyl siloxane) substrates which is the most potential candidate material for developing monolithic polymer devices in Lab-on-a-Chip technologies due to its facile fabrication of features, optical transparency, durability, low cost, high biocompatibility, and chemical stability. The functionalities of patterns can be stable during heating or in a long-term use. Furthermore, transfer patterning of multilayers makes it possible to incorporate patterns with different kinds of chemistry in a substrate by using a micro-positioning process. This implies that the multilayer transfer technique can be used in patterning different functionalities onto substrates for biosensor applications. Also, when the multilayers of conducting polymers are formed with dyes or particles and then transferred, the method of the present invention can be used in patterning three color pixels in display devices.

Preparation of the Stamp-Multilayer Complex

The process of preparing a polyelectrolyte multilayer entails binding a polyelectrolyte layer to the surface of a stamp by. The properties of the polymer that contact the surface of the stamp are important. The adhesive forces between the surface of the stamp and the polymeric layer is ideally strong enough to withstand stresses encountered during preparation of the multilayer, but yet not so strong as to prevent transfer of the multilayer to the substrate. The adhesive force between the surface of the stamp and the adjacent polymeric layer is generally a noncovalent interaction, such as hydrophobic, hydrogen bonding, electrostatic, or eleophobic.

In a preferred embodiment, PAH adheres to the surface of a PDMS stamp by non-electrostatic interactions to generate a charged, wettable surface for the construction of multilayers. The hydrophobic backbone of PAH accommodates the adsorption of a charged initial layer of polycation depending on pH conditions; the adhesion of this first layer is based on the hydrophobic interactions of the PAH hydrocarbon backbone and the PDMS surface. However, the adsorbed polyelectrolyte chains, e.g., PAH, in the first layer can be less stable and partially desorbed during the following process because solvating strength and agitation during rinsing steps can dominate the sticking energy of PAH chains to the surface. This unstableness of the first PAH layer is settled during the second dipping step in which the first layer experiences different ionic strength. In dipping the second SPS layer the PAH chains adsorbed form a uniform monolayer of overlapping chains maximizing the number of polymer segments-surface contacts. The salt ions which stay mobile and screen lateral repulsion allow more hydrophobic interactions among chains and between chains and the surface. The creation of this monolayer provides enough adhesive strength between the PAH and the PDMS stamp for the system to endure the dipping process in aqueous solutions and makes the multilayer film formed atop the PAH layer smooth and continuous. Without the conformational transition in the PAH intermediate layer, the multilayers formed may undergo cracking and wrinkling due to dewetting and shrinking phenomena during the assembly process.

The multilayer film is fabricated by alternating application of an anionic polymer and cationic polymer (FIG. 1). Representative examples of cationic polymers include linear or branched poly(ethylene imine), poly(allylamine hydrochloride), or poly(diallyldimethylammonium chloride). Representative examples of anionic polymers include poly(acrylic acid), sulfonated polystyrene or poly(2-acrylamido-2-methyl-1-propane-sulfonic acid). In certain embodiments, the last layer of the multilayer film formed on the surface of the stamp has strong interaction forces with substrate surfaces. The composite nature of the multilayer film is advantageous because the properties of the multilayer film can be tuned to a specific application. For example, the thickness of the multilayer is controlled by the number of polyanion/polycation absorption cycles. Furthermore, the individual polyanion or polycation components can be selected to impart a desired property to the film. This method can also be used to incorporate chemicals or molecules between the layers of the film. In certain embodiments, the surface of the PEM is first partially coated with a resist material that prevents adhesion of polyelectrolyte materials, then the resist coated PEM is exposed to a polyelectrolyte material. This procedure imparts additional structural features to the PEM that can beneficial properties. In certain embodiments, the resist material is EO-MAL.

Binding the Multilayer to the Substrate

Ideally, the process of transferring the multilayer simply involves contacting the multilayer film with the substrate. The film is constructed so that the layer of the film to be bonded to the substrate has suitable functional groups to provide maximum adhesion to the substrate. In certain circumstances, it is preferable to modify the surface of the substrate. For example, a PDMS sheet can be treated with air-plasma to enhance binding affinity to PDAC. In addition, exposure of both the PDAC-capped multilayer film and the plasma treated PDMS substrate to high humidity prior to contact has been found to enhance binding in the present invention.

Transferable Polyelectrolyte Multilayers

A polyelectrolyte multilayer transferred according to the methods of the present invention may comprise any combination of a wide range of individual polyelectrolytes. Table 1 depicts various polyelectrolytes comprised by multilayers that may be transferred according to the methods of the present invention. Obviously, numerous other polymers may be used in the polyelectrolyte multilayers transferred according to the present invention, including but not limited to poly(ethylene oxide), poly(vinyl alcohol), poly(ethylene imine), poly(diallyldimethylammonium chloride), chitosan, glycosaminoglycans, polylysine, poly(glutamic acid), poly(aspartic acid), alginate, RNA, DNA and enzymes.

TABLE 1

Various polyelectrolytes comprised by multilayers transferred according to the methods of the present invention.

| Polymer Name | Polymer Abbreviation | Polymer Structure | Charge/pH dependent or independent |
|---|---|---|---|
| Polyacrylic acid | PAA | [structure: -(CH$_2$-CH(COO$^-$))$_n$-] | Anionic/pH dependent |
| Polyallylamine hydrochloride | PAH | [structure: -(CH$_2$-CH(CH$_2$NH$_3^+$))$_n$-] | Cationic/pH dependent |
| Polyacrylamide | PAAm | [structure: -(CH$_2$-CH(C=O)(NH$_2$))$_n$-] | Neutral |
| Polymethacrylic acid | PMA | [structure: -(CH$_2$-C(CH$_3$)(COO$^-$))$_n$-] | Anionic/pH dependent |
| Polystyrene sulfonate | SPS | [structure: -(CH$_2$-CH(C$_6$H$_4$SO$_3^-$))$_n$-] | Anionic/pH independent |
| Polydiallyldimethylammonium chloride | PDAC | [structure: pyrrolidinium ring with N$^+$(CH$_3$)$_2$ Cl$^-$] | Cationic/pH independent |

Substrate

The mild conditions employed for binding the multilayer film to the substrate make this process amenable to a wide variety of substrate materials. The substrate may be a homogeneous or composite material. Representative examples of substrates include poly(dimethyl siloxane), a (PDAC/SPS)$_{10}$ multilayer platform with a SPS top surface on a silicon wafer, polystyrene, poly(methyl methacrylate), silicone, plastic, fabric, non-woven materials, metal, semiconductor, gold particle, and glass. In some cases, it is advantageous to modify the surface of the substrate to promote binding of the multilayer film to the substrate. In order to make interaction forces between multilayers and substrates stronger, functionalities can be introduced onto substrate surfaces by various techniques such as plasma treatment or another multilayer platform formation onto the substrates. This method provides a useful way to pattern stable chemical functionalities onto various substrates.

Preparation of Multilayers on Au or Si Substrate

Figure 5:
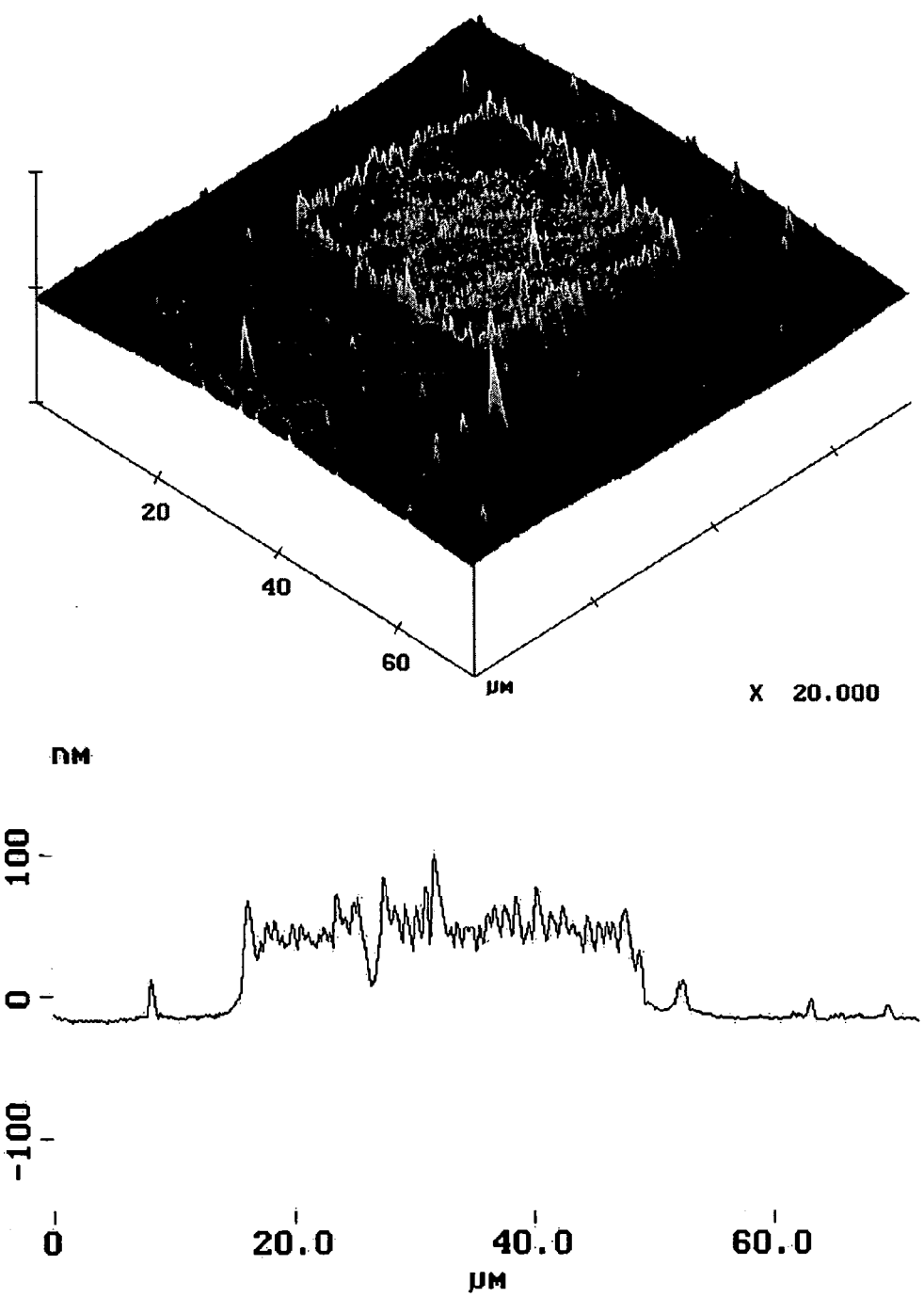
FIG. 5 depicts characterization of PAH/PAA bilayers

Five and one half (BPEI/PAA) bilayers were co-adsorbed onto a COOH SAM on Au or on a piranha solution cleaned Si substrate, with BPEI as the outermost layer. These platform layers were then stamped with EO-MAL, and SPS/PDAC multilayers were adsorbed onto the resulting chemically patterned surface of the BPEI/PAA base layers; typical results are shown in FIGS. 5a and b. FIG. 5a indicates negative deposition of (SPS/PDAC) multilayers induced when EO-MAL was stamped on a (PAA/BPEI) platform that was prepared with both PAA and BPEI solutions at pH 5. FIG. 5b illustrates that the EO-MAL template directed positive deposition of (SPS/PDAC) multilayers when the (PAA/BPEI) platform film was prepared from a BPEI solution at pH 7.0 and a PAA solution at pH 4.5. Ellipsometry results of continuous films on Si substrates show that when the polyelectrolyte platform is prepared at these pH conditions, the EO-MAL exhibits excellent resist qualities for (SPS/PDAC) multilayers; the EO-MAL surface contains only negligible amounts of adsorbed film on the surface. It is assumed the effectiveness of the EO-MAL monolayer as a resist is dependent on the formation of dense, brush layers, and the elimination of large quantities of unreacted, hydrolyzable anhydride groups. The effects seen in this experiment suggest that the pH of the platform layers is very important to the nature of the top BPEI surface, and thus the reactivity of the amine surface to the EO-MAL.

Preparation of PEM Multilayers on Polystyrene

Figure 9:
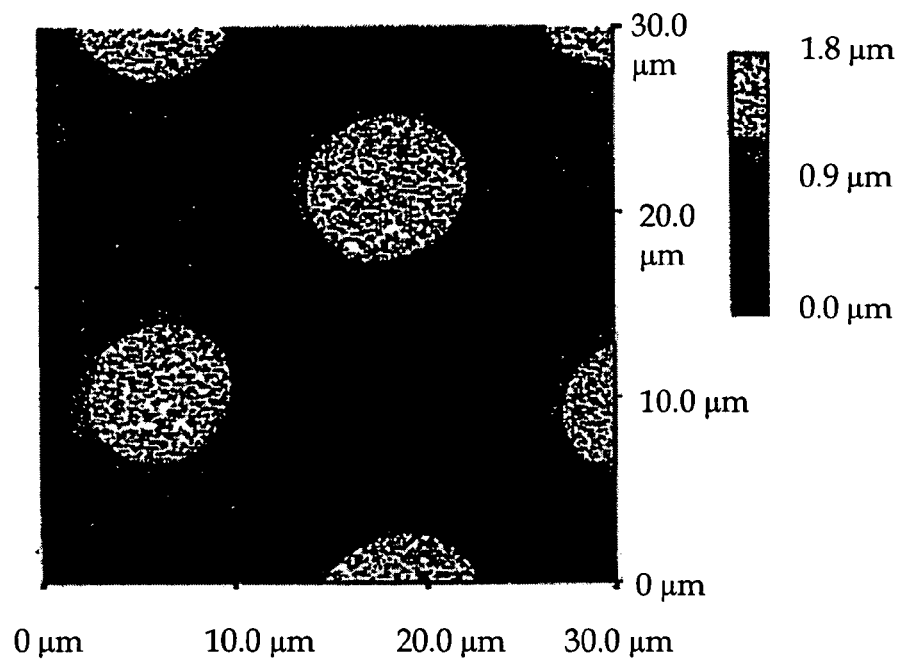
FIG. 9 depicts AFM images of patterned multilayers on various substrates: a) COOH SAM/Au substrate: (SPS/PDAC)16 on (BPEI/PAA)5BPEI platform layered at pH 5; b) Si substrate: (SPS/PDAC)10 on (BPEI/PAA)5BPEI platform layered at pH 4.5 for PAA and pH 7.0 for BPEI; and c) PS slide: (SPS/PDAC)15 on (BPEI/PAA)5BPEI platform layered at pH 5.

To demonstrate the use of a completely non-metallic substrate, multilayers were also adsorbed onto hydrophilic polystyrene slides to form (PAA/BPEI) base layers, which were then stamped with EO-MAL. In this case, the (PAA/BPEI) platform was layered at pH 5 onto the polystyrene surface and stamped; 15 bilayers of (SPS/PDAC) were deposited on the stamped surface to gain positive deposition (shown in FIG. 9c). These results are in contrast to the negative deposition observed for the system in FIG. 9a. On the other hand, the underlying substrate appears to have some influence on the top amine surface, despite the presence of five intermediate polyion bilayers. Several other researchers have observed surface effects in the build up of layer-by-layer films for the first three to ten polyion pairs. These effects may be due to compensations of charge at the surface, and thus depend on the relative charge of the underlying surface. If the top BPEI layer is more highly charged, it will be less reactive to EO-MAL. The relatively uncharged polystyrene substrate seems to result in adsorbed multilayers which are less highly charged at the top surface, possibly due to differences in the dielectric environment near the substrate surface. This surface can be stamped with EO-MAL and resulted in effective resist surface even with the multilayer platform prepared at the relatively low pH of 5.0, unlike the more highly charged SAMs prepared surfaces. It is also noteworthy that thicker films are obtained on the polystyrene substrate, presumably due to the adsorption of thick, loopy polyion layers on the weakly charged surface.

Formation of Microstructures in PEM Multilayers Using EO-MAL

Figure 10:
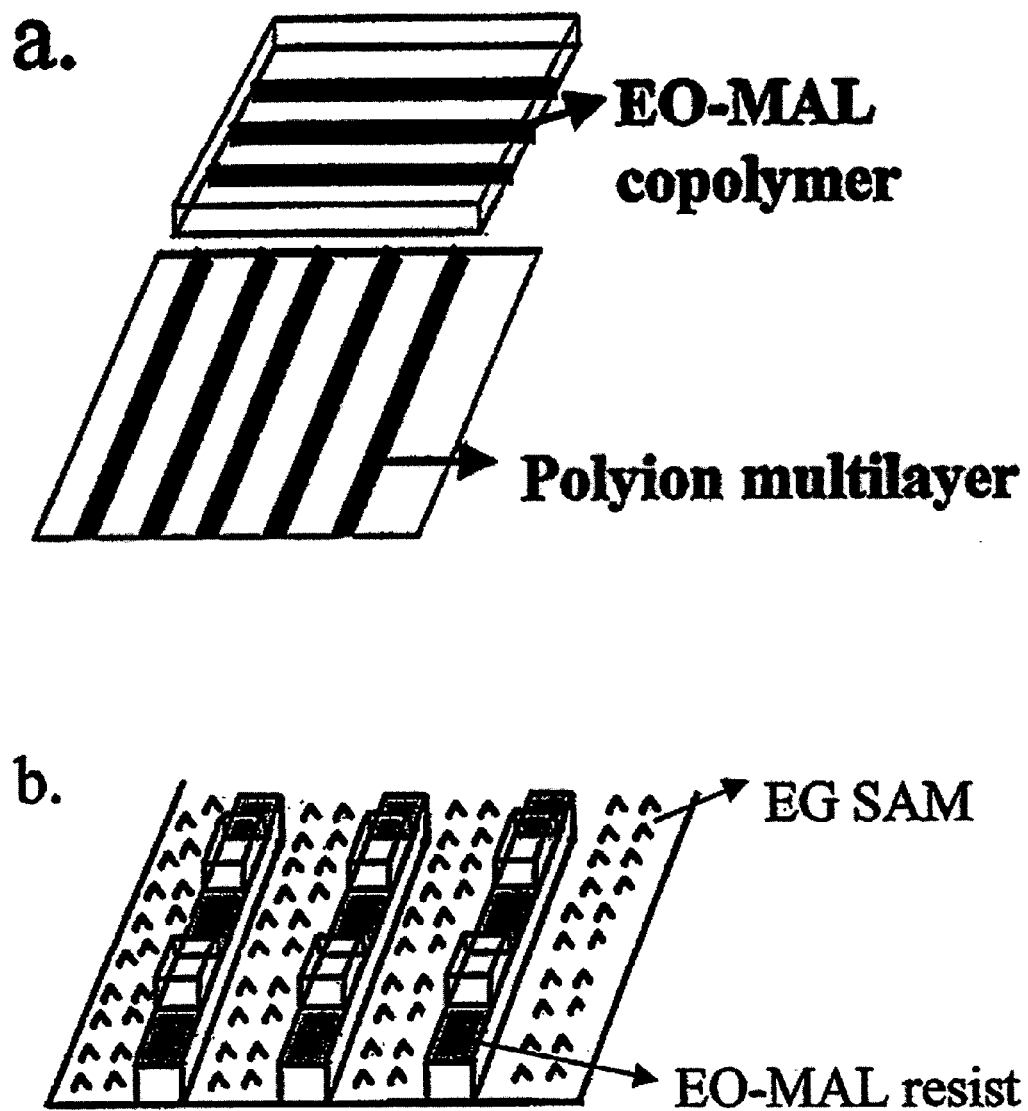
FIG. 10 depicts complex microstructures formed by stamping EO-MAL on patterned surfaces: a) a multiple level patterning scheme in which vertical stripes on the substrate are patterned polyion multilayers with polyamine as the outermost layer, and horizontal lines on the stamp represent EO-MAL ink which will be stamped atop the vertical stripes; b) a model of a complex structure formed by multiple stamping in which the shaded surfaces on the top of the first set of stripes indicate that the original amine surface has been modified with an ethylene glycol surface by stamping EO-MAL, causing the second set of multilayers to deposit only on unmodified amine surface forming cubes; c) an optical micrograph of a complex structure formed by 4 (LPEI/PAA) multilayers and 12 (LPEI/Ru dye) multilayers atop 12 (PDAC/SPS) multilayer stripes; and d) an AFM image of the same sample in which the raised cubes on the stripes correspond to 4 (LPEI/PAA) multilayers and 12 (LPEI/Ru dye) multilayers, and the stripes correspond to 12 (PDAC/SPS) multilayers.

One aspect of the invention is to transfer polyelectrolyte multilayers that have unique physical properties. In accomplishing this task, for example, a number of functional systems can be incorporated into the alternating layers of a multilayer film, and a second set of polymer multilayers can be applied atop the original system. In certain embodiments, the surface of the PEM is partially coated with a resist material that prevents adsorption of a polyelectrolyte material. Then, pockets in the PEM are created when additional polyelectrolyte layers are added. Then ability of EO-MAL to prevent additional adsorption of polyelectrolytes to the surface of a PEM film has been demonstrated. In one principle, EO-MAL was stamped directly onto a set of existing patterned polyion multilayers (FIG. 10a). Further deposition of polyelectrolyte layers resulted in deposition only on the regions which the stamp did not contact, forming the dimensional heterostructure shown in FIG. 10b. To achieve this structure, the patterned multilayer base film was fabricated using the chemically templated ionic multilayer assembly technique originally described by our group using patterned SAMs. FIGS. 10c and 10d show the optical micrograph and AFM images of a complex heterostructure constructed using this approach. Two different stamps with stripe features of different widths and spacings were selected for patterning. 12 bilayers of (PDAC/SPS) were first selectively adsorbed on the COOH SAM of a patterned (COOH/EG alkanethiol) gold substrate to produce the broader stripes seen in FIG. 10c. The adsorption of polyion multilayers was followed by a 30 minute immersion in BPEI solution at pH 8 to obtain a reactive polyamine top layer on the original set of stripes. The EO-MAL ink was then stamped to produce a set of more narrowly spaced lines perpendicular to the (PDAC/SPS) stripes by allowing the stamp to contact the surface for 1 hr. Following the stamping of the EO-MAL resist, 4 bilayers of (LPEI/PAA) and 12 bilayers of LPEI and a sulfonated ruthenium dye were deposited as periodic squares on the (PDAC/SPS) stripes. In this case, the wider regions are the regions containing EO-MAL, and the narrower regions were left unfunctionalized, and were therefore surfaces which allowed deposition of the LPEI/sulfonated ruthenium dye system.

Characterization of Polyelectrolyte Films

Film Characterization Using AFM

Microcontact printing of polymer systems involves the physical transfer of the polymer to a functional surface; under most circumstances, the material transferred by the stamp exceeds that of a single functional polymer monolayer. The excess polymer is then rinsed away with an appropriate solvent, leaving an adsorbed monolayer of the polymer on the surface. It is this single functional monolayer which is of interest for applications involving the chemical patterning of surfaces. Similar approaches are used in the transfer of common low molar mass monolayer forming systems such as silanes and alkanethiols using microcontact printing.

The polymer film transferred during the stamping of polyelectrolytes on surfaces is particularly thick due to the large cohesive interactions between polymer chains, and the viscous nature of the high molecular weight polymer. This thick layer is easily rinsed away with water, leaving the only the desired functional monolayer of interest strongly adsorbed to the surface. To determine the amount of material transferred during the stamping process, a gold substrate was treated with an COOH SAM, over which five-bilayer platforms of PDAC and SPS were adsorbed. The thickness of these platforms was roughly 200 Å before and after rinsing of the multilayer sample platforms. On top of these platforms, a print was made from a blank (unpatterned) stamp, using the optimized procedure described above (0.25M PDAC, in 75/25 ethanol/water for 1 minute). The statistical average thickness of the transferred layer is notably similar to the average thickness of 20 Å observed for a single adsorbed polyelectrolyte monolayer in the layer-by-layer adsorption process. This observation suggests that the transferred layer may be similar to that obtained using adsorption from solution. This observation provides an interesting comparison between polyelectrolyte layers adsorbed from dilute solution, and those truly adsorbed during the stamping process; this topic is a part of ongoing studies.

This data is consistent with AFM images taken of PDAC, in this case stamped from aqueous solution. The AFM of the surface before and after rinsing is shown in FIGS. 11a) and b). Prior to rinsing, the thickness of the stamped polymer layer shown is about 16 nm on average; following the rinsing process, the remaining polymer film is only 3 to 4 nm in height, a number which is again consistent with the range of thicknesses observed in polyelectrolyte multilayer adsorption. Interestingly, a clear and sharp image is obtained in both cases. The AFM is able to detect topographical differences in the film to image the patterned polymer monolayer; unfortunately, the surface roughness of the polyelectrolyte multilayer approaches and in many cases surpasses the thickness of the polymer monolayer, resulting in a great deal of noise in the final images, and making the AFM a less effective tool in imaging the actual chemical pattern produced using this method. For this reason, fluorescent imaging has been used to image the transferred polymer monolayers on the surface.

Film Characterization Using a Fluorescent Dye

To image regions of alternating positive and negative charge, stamped multilayer samples were stained with a negatively charged fluorescent dye, 6-CF (6-carboxyfluorescein, from Sigma) for a few seconds to no more than five minutes, and sonicated for two minutes in water. Caruso, F.; Lichtenfeld, H.; Donath, E.; Mohwald, H. *Macromolecules* 1999, 32, 2317–2328. They were then examined in a fluorescence optical microscope. The resulting prints produced were stable, and could be viewed weeks later with no change in appearance.

Optimization of Stamping Process

Figure 12:
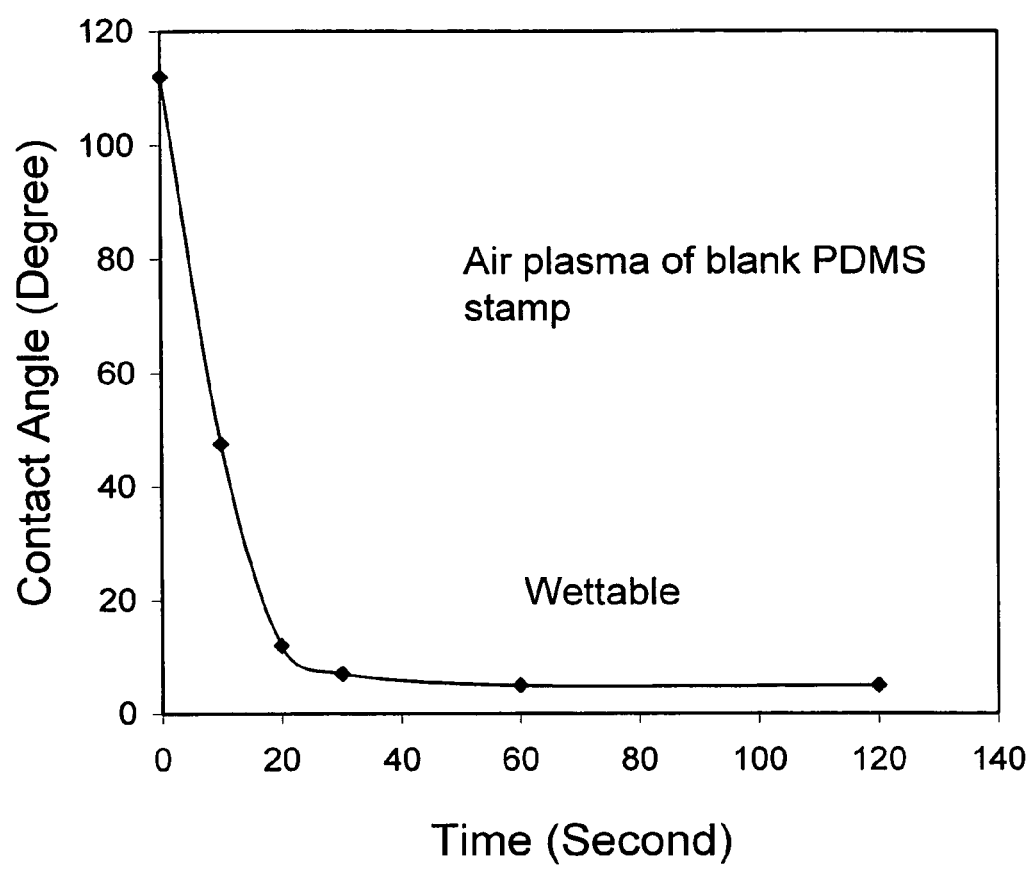
FIG. 12 depicts contact angle measurements of water on a blank PDMS surface as a function of its exposure time to air plasma.

Otimization of the of the stamping process include information on the role and range of solvent choice, concentration, and stamp exposure times. Examples are given below for microcontact printing involving transfer of a single polyelectrolyte layer. To be able to transfer charged or highly polar inks to the surface, it was necessary to treat the PDMS stamp with air plasma. Plasma times of 15 seconds or longer are sufficient to make the stamp wettable, as determined by contact angle measurements of a blank PDMS surface (see FIG. 12), which indicates a strong drop in contact angle of the PDMS surface at 15 to 20 seconds. The strong polyelectrolyte PDAC was stamped from dilute aqueous solutions and from water/ethanol mixtures at higher concentrations. We also found that SPS can be stamped onto PDAC surfaces. Patterning can be achieved from very dilute polyelectrolyte solutions using aqueous inking solutions containing 0.02M PDAC with 0.1M NaCl added as ink and 30 minutes of stamping time, provided that the PDMS stamp was plasma treated for 15 seconds. Similar results were observed with the stamping of SPS on a PDAC surface of an PDAC/SPS film using a 0.01M SPS aqueous solution with 0.1M NaCl as ink, 30 seconds of air plasma for the PDMS stamp, and a 30 minutes stamping time.

Figure 13:
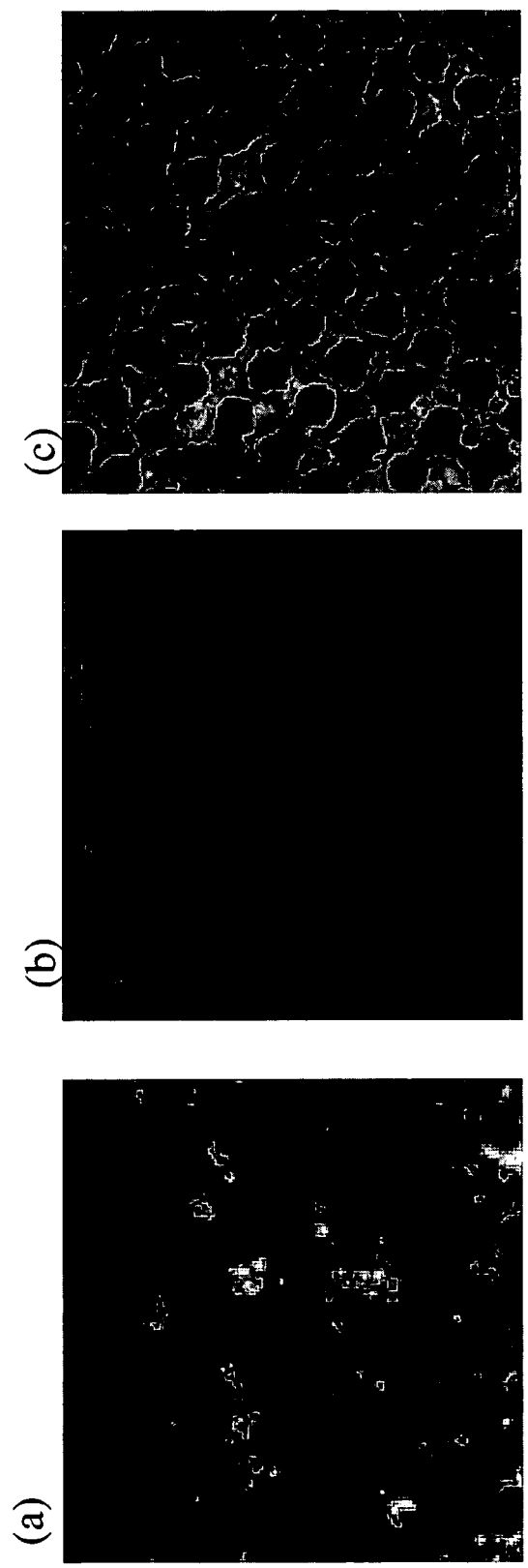
FIG. 13 depicts images of PDAC stamping using various solvent solutions and at various stamping times.

PDAC has been successfully stamped from concentrated solutions in water/ethanol mixtures at much shorter stamping times. Ethanol is a promising solvent because it is at once polar and volatile, which suggests that it can easily solubilize PDAC, yet it evaporates rapidly from the stamp, preventing "bleed" during the stamping process. Neither pure ethanol, nor a 25/75 by volume ethanol-water mixture produced good coverage of the polyelectrolyte. Insufficient coverage can produce black areas with no transferred film, or areas where only the edges of the pattern were transferred (rimming). This effect is shown in FIG. 13*a*. Solutions made in either 50/50 ethanol/water or 75/25 ethanol/water mixtures performed much better, with the 75/25 mixture giving uniform transferred polymer films, with well defined, clear edges. For most of these solutions, variations in coverage on the stamp during the inking process often produced streaks similar to brush strokes, as pictured in FIG. 13*b*.

A wide variety of stamping times have been tried— ranging from a few seconds to an hour. At longer stamping times, the stamp tended to adhere to the platform, making it difficult to remove. Due to this phenomenon, the resulting printed areas displayed cracked surface regions (see FIG. 13*c*). Shorter stamping times reduced the sticking, as did lighter coatings of ink. At very short stamp times (a few seconds), no PDAC was transferred to the platform. These results indicate that there is an optimal contact time for printing; for PDAC/ethanol solutions, optimal times were found at thirty seconds to one minute that resulted in good prints without great difficulty in removing the stamp. A number of concentrations of PDAC were also attempted using the ethanol/water solvent mixtures. Low concentrations (0.025M) produced poor or no transferred prints at all. Moderate concentrations (0.1M) performed well, but high concentrations (0.25M) performed best, giving highly uniform stamped regions over large areas. Based on the variables discussed above, the optimal stamping condition for PDAC was determined to be a 0.25M solution of PDAC in a 75/25 ethanol-water mixture, stamped for one minute. This set of conditions is markedly different from the successful aqueous stamping conditions, which work best at dilute concentrations and longer stamping times. Images are shown for samples stamped using optimal conditions from ethanol/water mixtures in FIG. 14. The presence of an alternating positive/negative pattern is made clear by the presence of the green dye on the positive PDAC regions. The dark black regions are the underlying SPS layer, which repels the dye because of electrostatic repulsion. It is clear that there is no bleed or unwanted transfer of PDAC in the SPS regions of the pattern, indicating a clean pattern transfer. A uniform layer can such as the one shown can be created over large areas. We have successfully patterned micron-sized features over approximately a centimeter square area; the possibility of patterning over large areas is therefore reasonable using this approach.

Patterned Conducting Films

An area in which the techniques described above will be applied toward practical problems is the creation of conducting polymer electrodes of micron scale dimensions. At this time, both polyaniline and the transparent conducting polymer, PEDOT, are the current focus of these investigations, although other conducting polymers may also be examined. Here the real challenges involve achieving unusually high adsorption selectivity on the surface. Conducting polymers are of particular interest for applications in which flexibility is an issue, such as Mylar substrates. Metal conducting films may also prove quite useful for this application, and these challenges apply to metal plating as well. Interest in the ability to pattern electrodes on a micron to submicron level has been expressed as a need from a number of different industries. Very recent preliminary results show that we can effectively pattern polyelectrolyte multilayers containing PEDOT (Baytron P suspension with SPS) utilizing alternating COOH/EG functional surfaces, as shown in FIG. 15. Similar results have been found with polyaniline (PANi) multilayer thin films. At this time, we are continuing to investigate a number of conducting polymers using selective deposition onto patterned substrates. It is our plan to investigate plastic and silicon substrates using the polymer-on-polymer method to create chemical templates for multilayer deposition. Four point probe conductivity measurements will be carried out to determine the electronic conductivity of these films.

As mentioned for the OLED and other systems, we can also use polymer-on-polymer stamped surfaces as templates for spin cast or solvent cast films of conducting polymers. MacDiarmid and coworkers have shown that alternating hydrophobic and hydrophilic regions of a surface can be used as a means of controlling the morphology of polyaniline deposited on the surface from solution, creating many orders of magnitude difference in the conductivity of films on the hydrophobic versus hydrophilic regions of the surface. In this work, the resolution of patterning was in the range of millimeters. Here we can examine similar effects with micron scale resolution to create patterned conducting films. The concepts of wetting/dewetting on films such as that shown in FIG. 12 will also be investigated with PEDOT cast films. Electrodes will be tested using traditional four point probe measurements, as well as by incorporation into simple devices, such as OLED devices. Finally, we can directly stamp charged conducting polymers onto surfaces to form patterned conducting thin films. The thickness and uniformity of these directly stamped layers will be evaluated and compared to films formed from selective adsorption or spin casting on patterned templates.

Stamp of the Invention

One aspect of the present invention relates to a stamp, comprising a first material bound to a second material, and a third material bound to said second material, wherein said first material is metal, glass, metal, fiber, non-woven material, plastic, a polymer, silicone, wood, or textile, said second material comprises a polyelectrolyte film, and said third material comprises a polyelectrolyte multilayer.

In certain embodiments, said second material comprises a linear or branched poly(ethylene imine), poly(allylamine hydrochloride), poly(diallyldimethylammonium chloride), poly(acrylic acid), sulfonated polystyrene, or poly(2-acrylamido-2-methyl-1-propane-sulfonic acid).

In certain embodiments, said second material is poly (allylamine hydrochloride).

In certain embodiments, said third material comprises a linear or branched poly(ethylene imine), poly(allylamine hydrochloride), poly(diallyldimethylammonium chloride), poly(acrylic acid), sulfonated polystyrene, or poly(2-acrylamido-2-methyl-1-propane-sulfonic acid).

In certain embodiments, said third material comprises alternating layers of poly(allylamine hydrochloride) and poly(acrylic acid) or poly(diallyldimethylammonium chloride) and sulfonated polystyrene.

In certain embodiments, said third material comprises alternating layers of poly(diallyldimethylammonium chloride) and sulfonated polystyrene.

In certain embodiments, the distal layer of said third material relative to said second material is poly(diallyldimethylammonium chloride).

In certain embodiments, said third material further comprises a dye.

In certain embodiments, said first material is glass, plastic, silicone, or polymer.

In certain embodiments, said first material is poly(dimethyl siloxane) or polystyrene.

In certain embodiments, said first material is poly(dimethyl siloxane).

In certain embodiments, said first material is poly(dimethyl siloxane), said second material is poly(allylamine hydrochloride), and said third material comprises alternating layers of poly(diallyldimethylammonium chloride) and sulfonated polystyrene.

In certain embodiments, the surface of said first material comprises a plurality of structural features.

In certain embodiments, said structural feature is a dot.

In certain embodiments, said dot is less than about 100 μm in diameter.

In certain embodiments, said dot is less than about 50 μm in diameter.

In certain embodiments, said dot is less than about 15 μm in diameter.

In certain embodiments, said dot is less than about 5 μm in diameter.

In certain embodiments, said dot is less than about 1 μm in diameter.

Method of Multilayer Transfer Using Polymer-on-Polymer Stamping

One aspect of the present invention relates to a method for transferring a polyelectrolyte multilayer to a substrate, comprising the steps of:

contacting a stamp with a substrate, wherein said stamp comprises a first material bound to a second material, and a third material bound to said second material, wherein said first material is metal, glass, metal, fiber, non-woven material, plastic, a polymer, silicone, wood, or textile, said second material comprises a polyelectrolyte film, said third material comprises a polyelectrolyte multilayer; and said substrate is metal, glass, plastic, a polymer, silicone, wood, or a textile.

In certain embodiments, said second material comprises a linear or branched poly(ethylene imine), poly(allylamine hydrochloride), poly(diallyldimethylammonium chloride), poly(acrylic acid), sulfonated polystyrene, or poly(2-acrylamido-2-methyl-1-propane-sulfonic acid).

In certain embodiments, the invention relates to the aforementioned method, wherein said second material is poly (allylamine hydrochloride).

In certain embodiments, the invention relates to the aforementioned method, wherein said third material comprises a linear or branched poly(ethylene imine), poly(allylamine hydrochloride), poly(diallyldimethylammonium chloride), poly(acrylic acid), sulfonated polystyrene, or poly(2-acrylamido-2-methyl-1-propane-sulfonic acid).

In certain embodiments, the invention relates to the aforementioned method, wherein said third material comprises alternating layers of poly(allylamine hydrochloride) and poly(acrylic acid) or poly(diallyldimethylammonium chloride) and sulfonated polystyrene.

In certain embodiments, the invention relates to the aforementioned method, wherein said third material comprises alternating layers of poly(diallyldimethylammonium chloride) and sulfonated polystyrene.

In certain embodiments, the invention relates to the aforementioned method, wherein the distal layer of said third material relative to said second material is poly(diallyldimethylammonium chloride).

In certain embodiments, the invention relates to the aforementioned method, wherein said third material further comprises a dye.

In certain embodiments, the invention relates to the aforementioned method, wherein said first material is glass, plastic, silicone, or polymer.

In certain embodiments, the invention relates to the aforementioned method, wherein said first material is poly(dimethyl siloxane) or polystyrene.

In certain embodiments, the invention relates to the aforementioned method, wherein said first material is poly(dimethyl siloxane).

In certain embodiments, the invention relates to the aforementioned method, wherein said first material is poly(dimethyl siloxane), said second material is poly(allylamine hydrochloride), and said third material comprises alternating layers of poly(diallyldimethylammonium chloride) and sulfonated polystyrene.

In certain embodiments, the invention relates to the aforementioned method, wherein the surface of said first material comprises a plurality of structural features In certain embodiments, the invention relates to the aforementioned method, wherein said structural feature is a dot.

In certain embodiments, the invention relates to the aforementioned method, wherein said dot is less than about 100 μm in diameter.

In certain embodiments, the invention relates to the aforementioned method, wherein said dot is less than about 50 μm in diameter.

In certain embodiments, the invention relates to the aforementioned method, wherein said dot is less than about 15 μm in diameter.

In certain embodiments, the invention relates to the aforementioned method, wherein said dot is less than about 5 μm in diameter.

In certain embodiments, the invention relates to the aforementioned method, wherein said dot is less than about 1 μm in diameter.

In certain embodiments, the invention relates to the aforementioned method, further comprising the step of treating said substrate with air-plasma.

In certain embodiments, the invention relates to the aforementioned method, wherein the distal layer of said third material relative to said second material is poly(diallyldimethylammonium chloride) and said substrate is PDMS.

In certain embodiments, the invention relates to the aforementioned method, further comprising the step of treating said substrate and said stamp with water.

In certain embodiments, the invention relates to the aforementioned method, wherein the distal layer of said third material relative to said second material is poly(diallyldimethylammonium chloride) and said substrate is PDMS.

EXEMPLIFICATION

The invention now being generally described, it will be more readily understood by reference to the following examples, which are included merely for purposes of illustration of certain aspects and embodiments of the present invention, and are not intended to limit the invention.

Example 1

Stamping Copolymers on a Surface to Serve as Templates for Additional Layers

Materials

Poly(acrylic acid) sodium salt (MW=20,000) (PAA), sodium poly(styrene sulfonate) (MW=35,000) (SPS), and linear polyethyleneimine (MW=25,000) (LPEI) were obtained from Polysciences. Polydiallyldimethyl ammonium chloride (MW=100,000–200,000) (PDAC) and branched polyethyleneimine (MW=25,000) (BPEI) were obtained from Aldrich. All polyelectrolytes were used as received without further purification. Polyelectrolyte dipping solutions were prepared with 18 MΩ Millipore water, and the pH of these solutions was adjusted with either HCl or NaOH. The concentrations of all polyelectrolytes were 0.01 M as based on the molecular repeat unit of the polymer, with the exception of the PDAC solution, which was 0.02M. Solutions were filtered with a 0.45 μm Acrodisc syringe filter (Pall Corporation) to remove any particulates. The copolymer of an oliogethylene oxide functionalized vinyl ether and maleic anhydride (Mn=14,000) (EO-MAL) was obtained from Shearwater Polymers, Inc. The concentration of EO-MAL was based on the formula weight of the nominal repeat unit of maleic anhydride and oligoethylene oxide allyl ether, which is 1670. A 2 mM solution of EO-MAL in acetonitrile was used as an ink for the PDMS stamp. To obtain a sample of neat EO-MAL for Grazing Angle FTIR (GA-FTIR), a 2 mM methanol solution of EO-MAL was used to cast continuous films onto zinc selenide plates. Aminopropyl trimethoxy silane was obtained from Aldrich and used as received. Poly(dimethylsiloxane) (PDMS) from the Sylgard 184 silicone elastomer kit (Dow Corning) was used to form stamps for micro-contact printing. The stamp used to make prints on the multilayers was a PDMS stamp. It was made by pouring a commercial PDMS mix (Sylguard, 184 silicone elastomer kit) over a silicon master etched with the desired pattern.

Substrate Preparation

Three different substrates were used. Silicon wafers(100, test grade) were obtained from Silicon Sense and were cleaned by immersion in a freshly prepared piranha solution of 70% conc. $H_2SO_4$(aq)/30% $H_2O_2$ (aq) (v/v) for 1 hr at 80° C. (Caution: piranha solution reacts violently with many organic materials and should be handled with care.) Gold substrates were prepared by electron beam evaporation of 100 Å Cr as an adhesion promoting layer, followed by 1000 Å Au onto silicon wafers. Gold substrates were rinsed by absolute ethanol, followed by $N_2$ blow dry right before use. Hydrophilic polystyrene (PS) cell culture slides were obtained from Nalge Nunc International and was rinsed by deionized water before use.

Micro-Contact Printing and Layer-by Layer Assembly for Thiol SAM on Au Substrate The microcontact printing method for alkane thiols on gold was followed as described by Kumar et al. (ref Whitesides again). The stamp was fabricated by casting poly (dimethylsiloxane) (PDMS) on a photolithographically prepared silicon master which was previously patterned with photo resist. The features of the photo resist pattern were replicated on the PDMS stamp surface after curing and the PDMS stamp can be peeled away and ready for use. A saturated solution of $HS(CH_2)_{15}COOH$ (COOH SAM hereafter) in hexadecane was used to ink the stamp. After evaporation of the solvent, the PDMS stamp was briefly dried under $N_2$ stream and was brought in contact with the substrate for 1 minute. The stamp was carefully peeled off and the substrate was rinsed with ethanol. The bare gold region was then functionalized with a second alkanethiol SAM $HS(CH_2)_{11}(OCH_2CH_2)_3OH$ (EG SAM hereafter) by immersion into a 1 mM solution of the thiol in absolute ethanol for 1 minute. The sample was finally rinsed with absolute ethanol to remove the excess alkanethiol and dried with $N_2$. Following these steps, the layer-by-layer deposition process was carried out using an automatic dipping machine (HMS programmable slide stainer from Carl Zeiss). In all cases, the first polyelectrolyte adsorbed was the cationic species, which adsorbs directly to the ionizable COOH/COO— patterned SAM. Each adsorption cycle consisted of immersion of the substrates in the polyelectrolyte solution for 15 minutes, followed by 2 agitated rinses in rinse water bins (the pH was not adjusted for strong polyelectrolyte cases, but the rinse water pH was adjusted to match the polyelectrolyte solution pH for weak polyelectrolyte cases.) The substrates were then dipped into the oppositely charged polyelectrolyte solution, followed by the same rinsing procedure. The samples were cleaned for 4 minutes in an ultrasonic cleaning bath (custom designed, Advanced Sonic Processing System) following the deposition of each polycation/polyanion pair. This process was repeated to build up multiple layers.

Patterning of EO-MAL on the Amine Surface and Complex Microstructure Fabrication Due to the polar nature of EO-MAL, the PDMS stamp was oxidized with $O_2$ plasma for 2 mins at 0.5 Torr and 50 sccm flow in a home-made plasma chamber to facilitate wetting of the stamp surface. The stamp was inked with EO-MAL solution shortly after plasma treatment. After inking with EO-MAL solution and drying under $N_2$, the stamp was placed in contact with the polyamine surface for 0.5–1 hr. Then the substrate was rinsed with ethanol to remove any excess material and used as a substrate in the polyion layer-by-layer process. In this case, the first layer adsorbed was always a polyanion, which can adsorb to the underlying positively charged polycation surface. The stamped regions were designed to act as resists to adsorption based on the oligoethylene glycol graft chains of EO-MAL. In the procedure of creating complex microstructures, EO-MAL was stamped onto a patterned polyamine surface, which was fabricated by the thiol SAMs templated ionic multilayer assembly described in the previous sub-section. The substrate was then used for the sequential adsorption layer-by-layer process as usual and new polyelectrolyte multilayers were built up outside the stamped region.

Characterization

AFM images were taken with a Digital Instruments Dimension 3000 AFM in tapping mode. Grazing angle FTIR (GA-FTIR) spectra were obtained in single reflection mode using Digilab Fourier transform infrared spectrometer (Biorad, Cambridge, Mass.). The p-polarized light was incident at 80° relative to the surface normal of the substrate, and a mercury-cadmium-telluride (MCT) detector was used to detect the reflected light. A spectrum of a SAM of n-hexadecanethiolate-d33 on gold was then taken as a reference. Laibinis, P. E.; Bain, C. D.; Nuzzo, R. G.; Whitesides, G. M. *J. Phys. Chem.* 1995, 99, 7663–7676.

Example 2

Stamping Block Copolymer, Graft Copolymer and Polyelectrolytes—Stamping of PS-b-PAA Block Copolymer Materials Poly(diallyldimethylammonium chloride) (PDAC) of MW=150,000 was purchased from Aldrich. Sulfonated polystyrene (SPS) of MW=70,000 was obtained from Aldrich. Poly(allylamine hydrochloride) (PAH) of MW=50,000–65,000 and poly(acrylic acid) (PAA) with MW=90,000 were purchased from Aldrich; polystyrene-polyacrylic acid diblock copolymer (PS-b-PAA) with a PS block MW=66,500 and PAA block MW=4,500 was obtained from Polysource. The aminopropyltrimethoxy silane was also obtained from Aldrich. The stamp used to make prints on the multilayers was a PDMS stamp. It was made by pouring a commercial PDMS mix (Sylguard, 184 silicone elastomer kit) over a silicon master etched with the desired pattern.

Substrate Preparation

Three different substrates were used as platforms for the stamping of the PS-b-PAA block copolymer. Direct stamping onto polyelectrolyte multilayer substrates was demonstrated using 10(PDAC/SPS) bilayers adsorbed on glass slides, and capped with a final layer of PAH. A single layer of polyelectrolyte was also used as a substrate; in this case, PAH was directly adsorbed on a gold-coated silicon wafer. These reflective samples were used for Grazing angle FTIR studies. Propylaminosilane SAMs were used as substrates for the stability studies. In this case, propylaminosilane SAMs were formed on Si substrates by immersing piranha cleaned Si substrates into a 2 mM ethanol solution of aminopropyltrimethoxy silane (Aldrich) for 2 hours.

Microcontact Printing

The general procedure of polymer-on-polymer stamping is shown in FIG. 7. A 10 mM PS-b-PAA/THF solution (concentration based on the formula weight of the nominal repeat unit of styrene and acrylic acid) was used to ink untreated PDMS stamps molded from lithographically-prepared -masters. Kumar, A.; Biebuyck, H. A.; Whitesides, G. M. *Langmuir* 1994, 10, 1498–1511. After evaporation of solvent, the PDMS stamp was briefly dried under a $N_2$ stream and was brought into contact with the substrate for 10–15 minutes at room temperature. All stamped surfaces were then rinsed with ethanol to remove unbound or loosely bound excess polymer. The substrates used, as described above, include strong polyelectrolyte multilayers capped with PAH at pH8.5, a single adsorbed monolayer of PAH on silicon, and an amino functionalized SAM on a Si substrate. A PDMS stamp containing an array of 10μm holes was used, and a water condensation image was immediately taken after the stamping process under optical microscope. Kumar, A.; Biebuyck, H. A.; Whitesides, G. M. *Langmuir* 1994, 10, 1498–1511.

Characterization

GA-FTIR spectra were obtained in single reflection mode using Digilab Fourier transform infrared spectrometer (Biorad, Cambridge, Mass.). The p-polarized light was incident at 80° relative to the surface normal of the substrate, and a mercury-cadmium-telluride (MCT) detector was used to detect the reflected light. A spectrum of a SAM of n-hexadecanethiolate-$d_{33}$ on gold was taken as a reference. Laibinis, P. E.; Bain, C. D.; Nuzzo, R. G.; Whitesides, G. M. *J. Phys. Chem.* 1995, 99, 7663–7676. The buffer solutions used in stability tests were made according to the CRC Handbook of Chemistry and Physics ($78^{th}$ Edition, 1997–1998), but diluted with deionized water to a final ionic strength equal to 10 mM. Accurate pH values were then measured with a pH meter after dilution. Potassium hydrogen phthalate (Aldrich) was used for the preparation of buffer solutions in the range of pH2–5. Potassium dihydrogen phosphate (Aldrich) was used for the preparation of buffer solutions in the range of pH7–10. Contact angles were measured on a Ramé-Hart goniometer (Ramé-Hart Inc., Mountain Lakes, N.J.) equipped with a video-imaging system. Water drops were placed on at least three locations on the surface in the ambient environment and measured on both sides of the drops. Contacting water drops were advanced and retreated with an Electrapipette (Matrix Technologies, Lowell, Mass.) at approximately 2 μl/s.

Example 3

Stamping of Polyelectrolytes on Charged Multilayer Surfaces

Substrate Preparation

The strong polyelectrolytes SPS and PDAC were used to form multilayer platforms on which solutions of the same polymers could be stamped. The platforms were built on glass slides cleaned with a dilute Lysol/water mixture in a sonicator. To start the first bilayer, the slides were then immersed for twenty minutes in the PDAC solution (0.02M PDAC, of MW 100,000–200,000, in Milli-Q water, with 0.1M NaCl, filtered to 0.22 microns). Following a two-minute rinse, the slides were placed into the SPS solution (0.01M SPS, of MW 70,000, in Milli-Q water, with 0.1M NaCl, filtered to 0.22 microns) and allowed to sit for 20 minutes. They were rinsed a second time, and sonicated for three minutes prior to repeating the procedure to make the next bilayer. Clark, S. L.; Montague, M. F.; Hammond, P. T. *Macromol.* 1997, 30, 7237–7244.

Microcontact Printing of Polyions

The PDMS stamp surfaces had to be made polar to increase their wettability to the polyelectrolyte solutions so that the stamps could be smoothly inked. Thus, clean stamps were placed in air plasma for twenty seconds before inking. The polymer solution, or ink, was then applied to the stamp surface using a cotton swab that was wet with the ink. This thin layer of ink was then dried in air, or with $N_2$ flow, and the stamp was placed on the multilayer platform and allowed to sit for a specified amount of time. Aqueous solutions of 20 mM PDAC and 0.1 M NaCl in water were used to stamp the polymer from aqueous solution. In this case, the stamping times ranged from 30 to 120 minutes. Ethanol/water mixtures were also used as inks. Five solvents of this type were tried: pure water, 75% water, 50% water, 25% water, and pure ethanol. The PDAC inks made with these solvents had concentrations of 0.025M, 0.1M, or 0.25M (based on repeat unit). In this study, the stamping times were varied systematically from a few seconds to an hour for each ethanol/water combination. Following the stamping process, the patterned surface was rinsed thoroughly with DI water applied directly to the film surface from a solvent squeeze bottle to remove any excess unbound polyelectrolyte.

Characterization

A dye was used to visualize the stamped polyelectrolyte monolayer following the stamping and rinsing processes. The dye used to image the stamped polycation, PDAC, was 6-carboxyfluorescein (6-CF), which was purchased and used as received from Sigma. The dye was dissolved directly in 0.1M NaOH; samples were imaged by dipping the substrates into the dye solution. The dye, which is negatively charged, selectively stained the positively charged PDAC surface. The dyed regions appear green when viewed with the fluorescence optical microscope, using a FITC filter. Caruso, F.; Lichtenfeld, H.; Donath, E.; Mohwald, H. *Macromolecules* 1999, 32, 2317–2328. Ellipsometry: All ellipsometry measurements were taken with a Gaertner Scientific Corporation ellipsometer, controlled by a Gateway 2000 computer running GEMP software. Fluorescence optical microscopy: All fluorescence optical microscopy was done with a Zeiss Axiovert, using a FITC filter. The pictures taken were captured by a Hamamatsu C4742-95 digital camera, and processed on a Macintosh G3 computer running Open Lab 2.0.2 software. AFM: After stamping polyelectrolytes atop a multilayer platform adsorbed onto SAMs treated Au substrates, the topography of the stamped polyelectrolyte layer was observed using the tapping mode of a Digital Instruments Dimension 3000 atomic force microscope (AFM) with a silicon etched tip (TESP).

Example 4

Multilayer Transfer Patterning

Stamp Preparation

PDMS stamps were created through the curing of a polysiloxane prepolymer atop a photolithographically prepared master, using standard literature procedures. The PDMS was then released from the master to obtain an elastomeric stamp with micron-scale topographical features of positive square patterns with 30×30 μm² area and 6 μm height. The PDMS stamp was immersed in an aqueous solution of poly(allyl amine hydrochloride) (PAH, 50 mM in repeat unit basis, pH 7.5, 15 min, no salt addition) to allow adsorption of a layer of polycation on the surface, followed by a brief rinsing in deionized water for 1 min with agitation. Following the adsorption of this first layer, alternating adsorption from sulfonated polystyrene (SPS, 10 mM, 0.1 NaCl) and poly (diallyldimethylammonium chloride) (PDAC, 20 mM, 0.1 NaCl) solutions yielded the construction of a complete polyelectrolyte multilayer on the stamp surface. After each dipping step for 15 min, the stamp was rinsed through three steps (2, 1, and 1 min). The final polyelectrolyte was PDAC, resulting in a positively charged top multilayer surface.

A negatively charged PDMS substrate was created by treating a PDMS sheet in air-plasma (60 W, 0.2 torr, 20 sec). Another negatively charged substrate was prepared by building a $(PDAC/SPS)_{10}$ multilayer platform with SPS top surface on a silicon wafer. The PDMS stamps containing the multilayer were placed in contact with the plasma treated PDMS sheet right after exposing both the stamp and the substrate to high humidity or with the SPS top surface on the silicon substrate for 30 minutes. When the stamp was removed, the patterned polyelectrolyte multilayer film was transferred to the PDMS sheet or the silicon substrate.

Characterization of Multilayer Film

The multilayer film on the surface of the stamp was characterized using atomic force microscopy (AFM). Following the stamping process, complete transfer of the multilayer was illustrated through the use of a fluorescent dye used to selectively stain amine groups. When a (PAH)1.0(SPS/PDAC)n multilayer is transferred, the top surface of the resulting multilayer should be the PAH layer that served as the base monolayer for polyelectrolyte build-up. Dansyl chloride fluorescent stain, which covalently binds to primary amine groups in biological assays, was used to selectively stain the amine groups of this top PAH layer in a transferred multilayer. This result proves that the resulting transferred film is complete, and that the multilayer remained completely intact during the transfer process. This fact is especially important in dealing with the transfer of functional thin films which require transfer without loss of material.

Specific Embodiment

1. PDMS Stamp and Substrate

A silicon master with a positive 30×30 μm² square feature was used to make a PDMS (Sylguard, 184 silicone elastomer kit, Dow Coming) stamp. PDMS cured on a silicon wafer without pattern was used as a substrate. The two-component siloxane was poured on both master and wafer, and cured for 24 h at 60° C.

2. Layer-by-Layer Assembly on Stamp

PDAC (Aldrich, MW=100–200 k), SPS (Aldrich, MW=70 k), PAH (Aldrich, MW=70 k), and PAA (Polysciences Inc., MW=90 k) were used as received. Aqueous solutions of 20 mM PDAC, 10 mM SPS, 10 mM PAH (pH 7.5), and 10 mM PAA (pH 3.5) were prepared by using Milli-Q water and filtered through a 0.22 μm cellulose acetate filter (Coming Inc.). NaCl (0.1 M) was added to both PDAC and SPS solutions; the pH of the PAH and PAA solutions was controlled using aqueous HCl and NaOH. Alternating layer-by-layer adsorption on the PDMS stamp using the above four solutions were performed by using an automatic dipping machine (Zeiss, DS 50). The adsorption procedure was programmed to assemble 1 PAH layer starting with the PAH solution, and then n PDAC/SPS bilayers ending with the PDAC solution.

3. Multilayer Stamping

The PDMS substrate was treated in air plasma (20 sec, 60 W, 0.18~0.20 torr) and brought into contact with the PDMS stamp for 30 min at room temperature.

4. Analysis

Optical micrographs were taken to observe the transferred multilayer and colloidal assembly. The topography was investigated using an atomic force microscope (Digital Instruments, Dimension 3000) in the tapping mode. The analysis revealed that multilayer transfer was achieved over the majority of the area (8×8 mm$^2$).

Incorporation by Reference

All of the patents and publications cited herein are hereby incorporated by reference.

EQUIVALENTS

Those skilled in the art will recognize, or be able to ascertain using no more than routine experimentation, many equivalents to the specific embodiments of the invention described herein. Such equivalents are intended to be encompassed by the following claims.

We claim:

1. A method for transferring a polyelectrolyte multilayer to a substrate, comprising the steps of:

contacting a stamp with a substrate, wherein said stamp comprises a first material bound to a second material, and a third material bound to said second material, wherein said first material is metal, glass, fiber, non-woven material, plastic, a polymer, silicone, wood, or textile, said second material comprises a polyelectrolyte film, said third material comprises a polyelectrolyte multilayer; and said substrate is metal, glass, plastic, a polymer, silicone, wood, or a textile.

2. The method of claim 1, wherein said second material comprises a linear or branched poly(ethylene imine), poly(allylamine hydrochloride), poly(diallyldimethylammonium chloride), poly(acrylic acid), sulfonated polystyrene, or poly(2-acrylamido-2-methyl-1-propane-sulfonic acid).

3. The method of claim 1, wherein said second material is poly(allylamine hydrochloride).

4. The method of claim 1, wherein said third material comprises alternating layers of poly(allylamine hydrochloride) and poly(acrylic acid) or poly(diallyldimethylammonium chloride) and sulfonated polystyrene.

5. The method of claim 1, wherein said third material comprises alternating layers of poly(diallyldimethylammonium chloride) and sulfonated polystyrene.

6. The method of claim 1, wherein the distal layer of said third material relative to said second material is poly(diallyldimethylammonium chloride).

7. The method of claim 1, wherein said third material further comprises a dye.

8. The method of claim 1, wherein said first material is glass, plastic, silicone, or polymer.

9. The method of claim 1, wherein said first material is poly(dimethyl siloxane) or polystyrene.

10. The method of claim 1, wherein said first material is poly(dimethyl siloxane).

11. The method of claim 1, wherein said first material is poly(dimethyl siloxane), said second material is poly(allylamine hydrochloride), and said third material comprises alternating layers of poly(diallyldimethylammonium chloride) and sulfonated polystyrene.

12. The method of claim 1, wherein the surface of said first material comprises a plurality of structural features.

13. The method of claim 12, wherein said structural feature is a dot.

14. The method of claim 13, wherein said dot is less than about 100 μm in diameter.

15. The method of claim 13, wherein said dot is less than about 50 μm in diameter.

16. The method of claim 13, wherein said dot is less than about 15 μm in diameter.

17. The method of claim 13, wherein said dot is less than about 5 μm in diameter.

18. The method of claim 13, wherein said dot is less than about 1 μm in diameter.

19. The method of claim 1, further comprising the step of treating said substrate with air-plasma.

20. The method of claim 19, wherein the distal layer of said third material relative to said second material is poly(diallyldimethylammonium chloride) and said substrate is PDMS.

21. The method of claim 1, further comprising the step of treating said substrate and said stamp with water.

22. The method of claim 21, wherein the distal layer of said third material relative to said second material is poly(diallyldimethylammonium chloride) and said substrate is PDMS.

* * * * *